United States Patent
Okajima et al.

(10) Patent No.: US 10,453,735 B2
(45) Date of Patent: Oct. 22, 2019

(54) SUBSTRATE PROCESSING APPARATUS, REACTION TUBE, SEMICONDUCTOR DEVICE MANUFACTURING METHOD, AND RECORDING MEDIUM

(71) Applicant: KOKUSAI ELECTRIC CORPORATION, Tokyo (JP)

(72) Inventors: Yusaku Okajima, Toyama (JP); Hidenari Yoshida, Toyama (JP); Shuhei Saido, Toyama (JP); Takafumi Sasaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/137,879

(22) Filed: Sep. 21, 2018

(65) Prior Publication Data
US 2019/0096738 A1    Mar. 28, 2019

(30) Foreign Application Priority Data
Sep. 26, 2017 (JP) .................................. 2017-184794

(51) Int. Cl.
*H01L 21/67* (2006.01)
*H01L 21/68* (2006.01)
(Continued)

(52) U.S. Cl.
CPC ...... *H01L 21/68792* (2013.01); *C23C 16/345* (2013.01); *C23C 16/458* (2013.01);
(Continued)

(58) Field of Classification Search
CPC ......... H01L 21/68792; H01L 21/67017; H01L 21/67109; H01L 21/67069;
(Continued)

(56) References Cited

U.S. PATENT DOCUMENTS 4,263,872 A * 4/1981 Ban ...................... C23C 16/455
 118/721
5,217,560 A * 6/1993 Kurono ............... H01J 37/3244
 118/723 R
(Continued)

FOREIGN PATENT DOCUMENTS

JP  01047018 A * 2/1989
JP  01081216 A * 3/1989
(Continued)

OTHER PUBLICATIONS

Machine translation of Tanaka, Akinori et al. (JP 2011061037 A).*

*Primary Examiner* — Rudy Zervigon

(74) *Attorney, Agent, or Firm* — Volpe and Koenig, P.C.

(57) ABSTRACT

A substrate processing apparatus includes: a reaction tube including inner and outer tubes installed to surround the inner tube; a substrate holder for holding substrates in a vertical direction; gas nozzles installed in a gap between the outer and inner tubes and having supply holes from which a gas is supplied toward an inlet port of the inner tube; a gas supply system for feeding gases to the reaction tube though the gas nozzles; an outlet port formed in the inner tube to flow out the gas; a discharge port for discharging the gas; a discharge part for discharging the gas staying in the gap from the discharge port; and a controller for controlling the gas supply system to supply a precursor gas and an inert gas and for causing the discharge part to purge the gas staying in the gap with the inert gas.

5 Claims, 15 Drawing Sheets

(51) Int. Cl.
*C23C 16/455* (2006.01)
*C23C 16/34* (2006.01)
*H01L 21/687* (2006.01)
*C23C 16/458* (2006.01)

(52) U.S. Cl.
CPC .. *C23C 16/45546* (2013.01); *C23C 16/45578* (2013.01); *H01L 21/67017* (2013.01); *H01L 21/67069* (2013.01); *H01L 21/67109* (2013.01)

(58) Field of Classification Search
CPC ......... H01L 21/67155; H01L 21/67178; C23C 16/45546; C23C 16/345; C23C 16/458; C23C 16/45578; C23C 16/45563; C23C 16/45568; C23C 16/4557; C23C 16/45572; C23C 16/45574
USPC ...................................... 118/719; 156/345.33
See application file for complete search history.

(56) References Cited

U.S. PATENT DOCUMENTS

| | | | | | |
|---|---|---|---|---|---|
| 5,383,984 | A | * | 1/1995 | Shimada | H01J 37/32522 118/723 ER |
| 5,618,349 | A | * | 4/1997 | Yuuki | C23C 16/4412 118/715 |
| 6,204,194 | B1 | * | 3/2001 | Takagi | C23C 16/4412 257/E21.279 |
| 6,444,262 | B1 | * | 9/2002 | Kitamura | C23C 16/4412 427/248.1 |
| 6,881,295 | B2 | * | 4/2005 | Nagakura | C23C 16/401 118/715 |
| D552,047 | S | * | 10/2007 | Sugawara | D13/182 |
| 7,861,668 | B2 | * | 1/2011 | Toyoda | C23C 16/452 118/723 E |
| 7,900,580 | B2 | * | 3/2011 | Kontani | C23C 16/452 118/723 E |
| 7,927,662 | B2 | * | 4/2011 | Matsuura | C23C 16/36 427/255.31 |
| 8,002,895 | B2 | * | 8/2011 | Inoue | C23C 16/45578 118/715 |
| 8,461,062 | B2 | * | 6/2013 | Sakai | C23C 16/405 118/696 |
| 8,555,808 | B2 | * | 10/2013 | Yamamoto | C23C 16/345 118/723 E |
| 9,028,614 | B2 | * | 5/2015 | Hara | C30B 25/08 118/724 |
| 9,039,912 | B2 | * | 5/2015 | Toyoda | C23C 16/452 216/71 |
| 9,074,284 | B2 | * | 7/2015 | Fukuda | C23C 16/325 |
| 9,175,395 | B2 | * | 11/2015 | Asai | C23C 16/08 |
| 9,593,415 | B2 | * | 3/2017 | Yang | C23C 16/4412 |
| 9,620,395 | B2 | * | 4/2017 | Yang | C23C 16/4412 |
| 2001/0050054 | A1 | * | 12/2001 | Kwag | C23C 16/4412 118/715 |
| 2004/0025786 | A1 | * | 2/2004 | Kontani | C23C 16/452 118/715 |
| 2007/0137794 | A1 | * | 6/2007 | Qiu | C23C 16/45504 156/345.33 |
| 2008/0166886 | A1 | * | 7/2008 | Sakai | C23C 16/45546 438/778 |
| 2009/0197424 | A1 | * | 8/2009 | Sakai | C23C 16/405 438/758 |
| 2010/0117203 | A1 | * | 5/2010 | Bailey | C30B 29/06 257/627 |
| 2010/0297832 | A1 | * | 11/2010 | Imai | C23C 16/325 438/478 |
| 2010/0300357 | A1 | * | 12/2010 | Yamamoto | C23C 16/345 118/723 E |
| 2010/0330781 | A1 | * | 12/2010 | Sasaki | C23C 16/325 438/478 |
| 2011/0000425 | A1 | * | 1/2011 | Saido | C23C 16/325 117/88 |
| 2011/0204036 | A1 | * | 8/2011 | Murobayashi | H01L 21/67109 219/201 |
| 2011/0252899 | A1 | * | 10/2011 | Felts | C23C 16/045 73/865.8 |
| 2011/0306212 | A1 | * | 12/2011 | Sato | C23C 16/325 438/706 |
| 2012/0076936 | A1 | * | 3/2012 | Hirano | C23C 16/45563 427/248.1 |
| 2012/0100722 | A1 | * | 4/2012 | Asai | C23C 16/08 438/758 |
| 2012/0119337 | A1 | * | 5/2012 | Sasaki | C23C 16/403 257/632 |
| 2012/0214317 | A1 | * | 8/2012 | Murobayashi | C23C 16/325 438/782 |
| 2012/0280369 | A1 | * | 11/2012 | Saito | C23C 16/405 257/629 |
| 2012/0315767 | A1 | * | 12/2012 | Sasaki | C23C 16/325 438/758 |
| 2013/0072002 | A1 | * | 3/2013 | Toyoda | C23C 16/452 438/478 |
| 2013/0330930 | A1 | * | 12/2013 | Saido | C23C 16/4557 438/758 |
| 2014/0073146 | A1 | * | 3/2014 | Okada | H01L 21/263 438/798 |
| 2014/0213069 | A1 | * | 7/2014 | Takebayashi | H01L 21/67109 438/770 |
| 2014/0315375 | A1 | * | 10/2014 | Yang | C23C 16/4412 438/488 |
| 2014/0345528 | A1 | * | 11/2014 | Yang | H01L 21/67126 |
| 2014/0345801 | A1 | * | 11/2014 | Yang | C23C 16/4412 156/345.27 |
| 2014/0348617 | A1 | * | 11/2014 | Yang | H01L 21/6719 414/172 |
| 2014/0357058 | A1 | * | 12/2014 | Takagi | H01L 21/0262 438/478 |
| 2015/0013909 | A1 | * | 1/2015 | Yang | C23C 16/4412 156/345.29 |
| 2015/0275359 | A1 | * | 10/2015 | Fukushima | C23C 16/4412 118/712 |
| 2017/0037512 | A1 | | 2/2017 | Saido et al. | |
| 2017/0067159 | A1 | * | 3/2017 | Isobe | C23C 16/403 |
| 2017/0073813 | A1 | * | 3/2017 | Hyon | C23C 16/45578 |
| 2017/0114464 | A1 | * | 4/2017 | Iriuda | C23C 16/4584 |
| 2017/0232457 | A1 | * | 8/2017 | Fujino | B05B 7/1693 118/724 |
| 2017/0294318 | A1 | * | 10/2017 | Yoshida | H01L 21/67109 |
| 2018/0076021 | A1 | * | 3/2018 | Fukushima | C23C 16/4412 |
| 2018/0135176 | A1 | * | 5/2018 | Morikawa | C23C 16/405 |
| 2018/0274098 | A1 | * | 9/2018 | Takagi | C23C 16/45502 |
| 2018/0355481 | A1 | * | 12/2018 | Kang | C23C 16/4412 |
| 2018/0371614 | A1 | * | 12/2018 | Yoshida | H01L 21/67017 |
| 2019/0017169 | A1 | * | 1/2019 | Hanashima | C23C 16/45563 |
| 2019/0071777 | A1 | * | 3/2019 | Yoshida | C23C 16/345 |
| 2019/0093224 | A1 | * | 3/2019 | Yoshida | C23C 16/45578 |
| 2019/0096738 | A1 | * | 3/2019 | Okajima | C23C 16/458 |

FOREIGN PATENT DOCUMENTS

| | | | | |
|---|---|---|---|---|
| JP | 02146725 | A | * | 6/1990 |
| JP | 04184923 | A | * | 7/1992 |
| JP | 2004296659 | A | * | 10/2004 |
| JP | 2005209668 | A | * | 8/2005 |
| JP | 2006080101 | A | * | 3/2006 |
| JP | 2006203033 | A | * | 8/2006 |
| JP | 2009081457 | A | * | 4/2009 |
| JP | 2010034406 | A | * | 2/2010 | .......... C23C 16/405 |
| JP | 2010050439 | A | * | 3/2010 | .......... C23C 16/405 |
| JP | 2011061037 | A | * | 3/2011 |
| JP | 2012023073 | A | * | 2/2012 |
| JP | 2012069723 | A | * | 4/2012 | ....... C23C 16/45563 |
| JP | 2013051374 | A | * | 3/2013 |
| JP | 2016157930 | A | * | 9/2016 |
| WO | 2015/041376 | A1 | | 7/2017 |

\* cited by examiner

SUBSTRATE PROCESSING APPARATUS, REACTION TUBE, SEMICONDUCTOR DEVICE MANUFACTURING METHOD, AND RECORDING MEDIUM

CROSS-REFERENCE TO RELATED APPLICATION

This application is based upon and claims the benefit of priority from Japanese Patent Application No. 2017-184794, filed on Sep. 26, 2017, the entire contents of which are incorporated herein by reference.

TECHNICAL FIELD

The present disclosure relates to a substrate processing apparatus, a reaction tube, a semiconductor device manufacturing method, and a non-transitory computer-readable recording medium.

BACKGROUND

A semiconductor manufacturing apparatus is an example of a substrate processing apparatus. A vertical apparatus is known as an example of the semiconductor manufacturing apparatus.

This type of substrate processing apparatus includes a boat as a substrate holding member which accommodates wafers in a reaction tube while holding the wafers in multiple stages. The wafers held by the boat are processed in a process chamber provided inside the reaction tube.

For example, there is known a configuration in which a plurality of wafers to be processed in a batch manner is held by a boat. By simultaneously supplying two or more types of precursor gases to a reaction tube into which the wafers are loaded, a film is formed on each of the wafers.

In addition, there is known a configuration in which a cap heater is installed inside a quartz cylinder and heat energy is supplemented from below a wafer so that a heating time is shortened and a purge gas is prevented from affecting a wafer region.

In a substrate processing apparatus including a reaction tube of a double structure, a gas tends to stay in a gap between an outer tube and an inner tube which constitute the reaction tube. When the gas stays in this gap, byproducts are accumulated in the gap, thus generating particles.

SUMMARY

The present disclosure provides some embodiments of a technique of suppressing byproducts from being generated in a gap between an outer tube and an inner tube which constitute a reaction tube.

According to one embodiment of the present disclosure, there is provided a substrate processing apparatus, including: a reaction tube including a cylindrical inner tube and a cylindrical outer tube installed so as to surround the cylindrical inner tube; a substrate holder accommodated in the cylindrical inner tube and configured to hold a plurality of substrates in a vertical direction; gas nozzles installed in a gap between the cylindrical outer tube and the cylindrical inner tube to extend along the vertical direction, and having a plurality of supply holes formed in the vertical direction, from which a gas is supplied toward an inlet port formed in the cylindrical inner tube; an gas supply system configured to feed gases to the reaction tube though the gas nozzles; an outlet port formed in the cylindrical inner tube and configured to allow the gas supplied to the cylindrical inner tube to flow out therethrough; a discharge port formed in the cylindrical outer tube and configured to discharge the gas flowing out from the outlet port to outside of the reaction tube; a discharge part configured to discharge the gas staying in the gap from the discharge port; and a controller configured to control the gas supply system to supply a precursor gas and an inert gas so that the film is formed on each of the plurality of substrates, and configured to cause the discharge part to purge the gas staying in the gap with the inert gas, so that the gas staying in the gap is discharged.

DETAILED DESCRIPTION

First Embodiment

Hereinafter, a first embodiment of the present disclosure will be described with reference to the figures.

Figure 1:
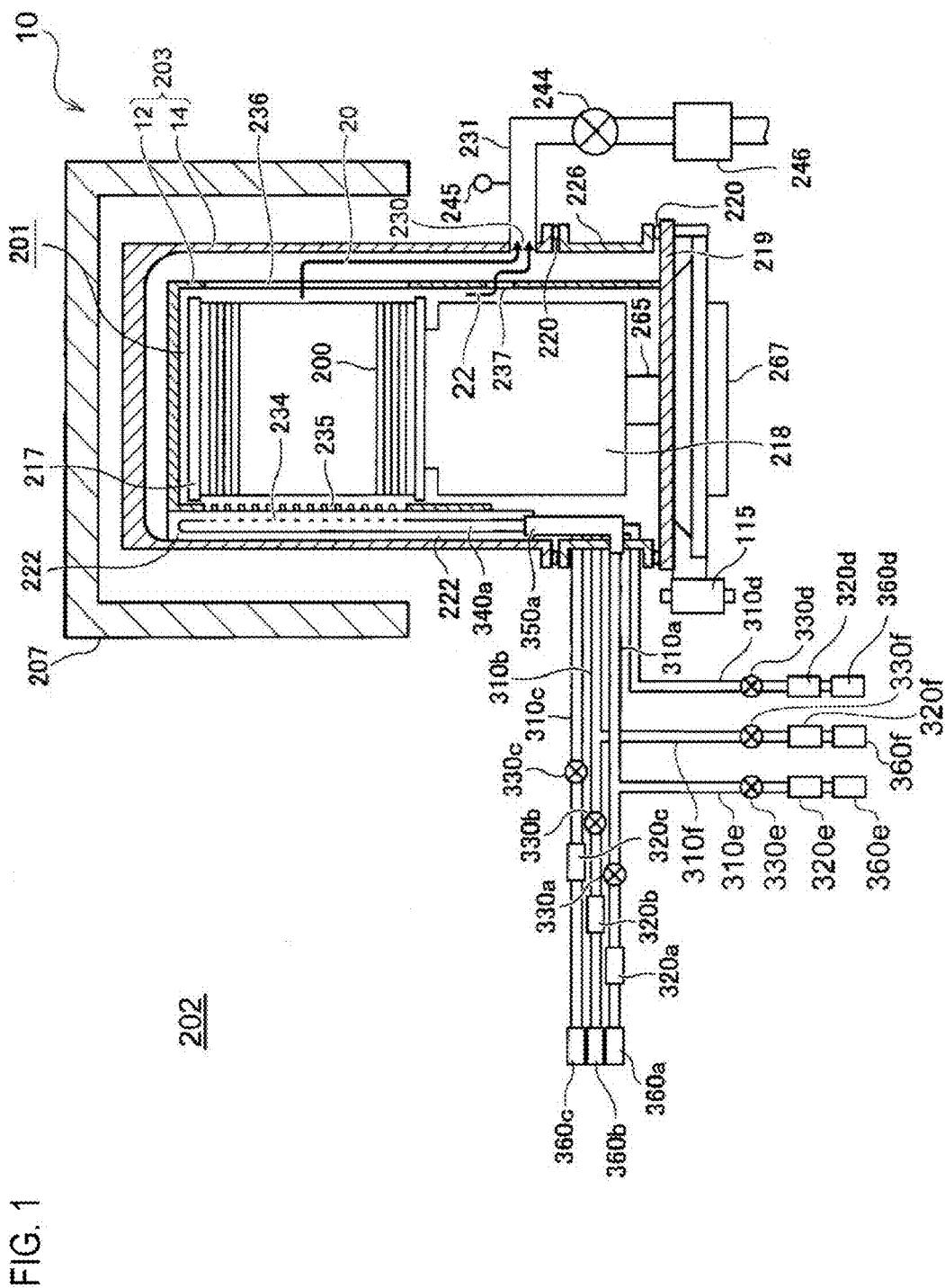
FIG. 1 is a schematic configuration diagram of a substrate processing apparatus according to a first embodiment.

FIG. 1 is a view showing a substrate processing apparatus 10 according to the present embodiment. The substrate processing apparatus 10 is used for manufacturing a semiconductor device.

The substrate processing apparatus 10 includes a processing furnace 202. The processing furnace 202 includes a heater 207 used as heating means. The heater 207 has a cylindrical shape and is vertically installed while being supported by a heater base (not shown). The heater 207 also functions as an activation mechanism for thermally activating a processing gas.

A reaction tube 203 constituting a reaction container is disposed inside the heater 207 in a concentric relationship with the heater 207. The reaction tube 203 is made of a heat-resistant material such as, for example, quartz ($SiO_2$) or silicon carbide (SiC).

Figure 2:
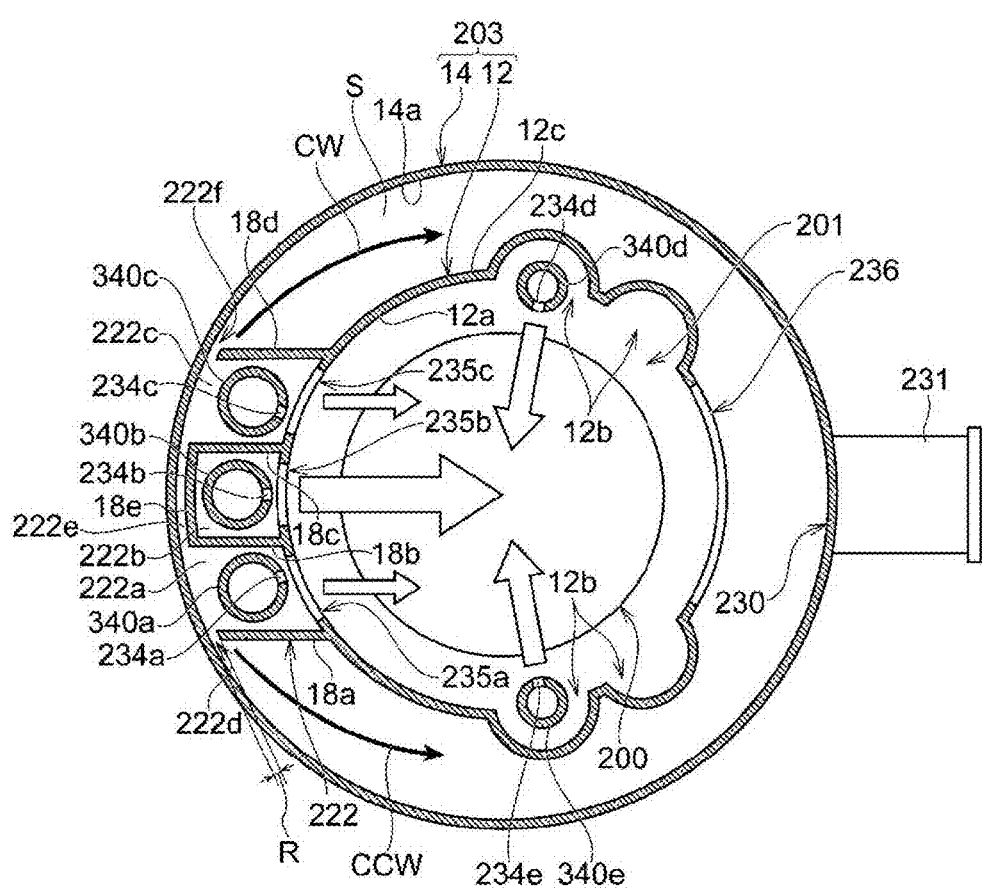
FIG. 2 is a horizontal sectional view of a vertical processing furnace of the substrate processing apparatus according to the first embodiment.

As also shown in FIG. 2, the reaction tube 203 includes a cylindrical inner tube 12 and a cylindrical outer tube 14 installed so as to surround the inner tube 12. The inner tube 12 is disposed in a concentric relationship with the outer tube 14. A gap S is defined between the inner tube 12 and the outer tube 14.

As shown in FIG. 1, the inner tube 12 is formed in a roofed shape with its lower end opened and its upper end closed by a flat wall. Likewise, the outer tube 14 is formed in a roofed shape with its lower end opened and its upper end closed by a flat wall.

As shown in FIG. 2, a nozzle arrangement chamber 222 is installed in the gap S defined between the inner tube 12 and the outer tube 14. Gas supply slits 235a, 235b and 235c as one example of inlet ports are formed in a peripheral wall of the inner tube 12.

Figure 3:
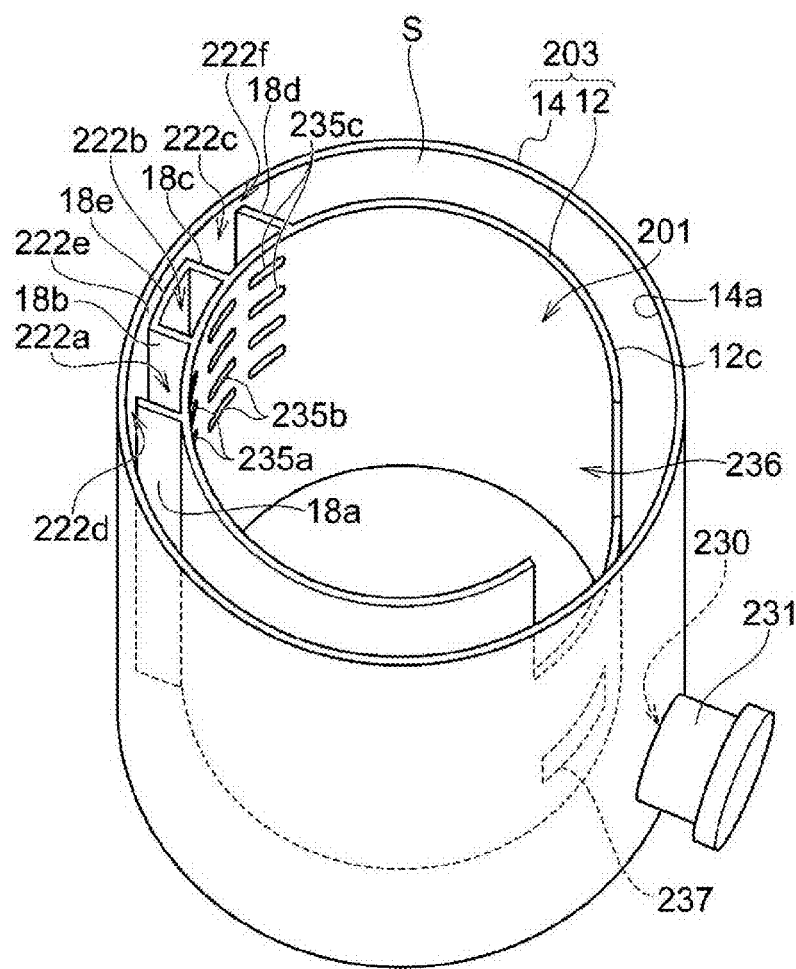
FIG. 3 is a perspective sectional view of the vertical processing furnace of the substrate processing apparatus according to the first embodiment.

As shown in FIG. 3, a first gas exhaust port 236, which is an example of an outlet port, is formed in a portion facing the gas supply slits 235a, 235b and 235c in the peripheral wall of the inner tube 12. In addition, a second gas exhaust port 237, which is another example of an outlet port having a smaller opening area than that of the first gas exhaust port 236, is formed under the first gas exhaust port 236.

The interior of the inner tube 12 constitutes a process chamber 201 as shown in FIG. 1. The process chamber 201 processes wafers 200 as substrates.

The process chamber 201 is configured to accommodate a boat 217 which is an example of a substrate holder capable of holding the wafers 200 which are stacked and arranged in a horizontal posture toward a vertical direction. The inner tube 12 encloses the accommodated wafers 200.

A lower end of the reaction tube 203 is supported by a cylindrical manifold 226. The manifold 226 is made of metal such as, for example, nickel alloy or stainless steel, or is made of a heat-resistant material such as quartz or SiC. A flange is formed at an upper end portion of the manifold 226. A lower end portion of the outer tube 14 is installed and supported on the flange.

A sealing member 220 such as an O ring or the like is installed between the flange and the lower end portion of the outer tube 14. Thus, the interior of the reaction tube 203 is hermetically sealed.

A seal cap 219 is airtightly attached to a lower end opening of the manifold 226 via a sealing member 220 such as an O-ring or the like. Thus, the side of the lower end opening of the reaction tube 203, namely the opening of the manifold 226, is hermetically sealed. The seal cap 219 is made of metal such as, for example, nickel alloy or stainless steel, and is formed in a disc shape. An outer surface of the seal cap 219 may be covered with a heat-resistant material such as quartz ($SiO_2$) or silicon carbide (SiC).

A boat support base 218 for supporting the boat 217 is installed above the seal cap 219. The boat support base 218 is made of a heat-resistant material such as, for example, quartz or SiC, and functions as a heat insulating part.

The boat 217 is installed upward on the boat support base 218. The boat 217 is made of a heat-resistant material such as, for example, quartz or SiC. The boat 217 includes a bottom plate (not shown) fixed to the boat support base 218 and a top plate arranged above the bottom plate. A plurality of support columns 217a (see FIGS. 9 and 10) is installed between the bottom plate and the top plate.

The plurality of wafers 200 to be processed in the process chamber 201 inside the inner tube 12 is held by the boat 217. The plurality of wafers 200 is supported by the support columns 217a (see FIGS. 9 and 10) of the boat 217 in a state in which the wafers 200 are held in a horizontal posture at regular intervals with their centers aligned with each other. A direction in which the wafers 200 are stacked is defined as an axis direction of the reaction tube 203.

A boat rotation mechanism 267 for rotating the boat 217 is installed under the seal cap 219. A rotating shaft 265 of the boat rotation mechanism 267 extends through the seal cap 219 and is connected to the boat support base 218. The boat rotation mechanism 267 rotates the boat 217 via the boat support base 218, thereby rotating the wafers 200.

The seal cap 219 is raised and lowered in the vertical direction by a boat elevator 115 as an elevating mechanism installed outside the reaction tube 203, so that the boat 217 can be loaded into and unloaded from the process chamber 201.

Nozzle support parts 350a to 350c (see FIG. 4) configured to support gas nozzles 340a to 340e for supplying gases into the process chamber 201 are installed in the manifold 226 so as to penetrate the manifold 226 (only the gas nozzle 340a and the nozzle support part 350a are shown).

In the present embodiment, five nozzle support parts 350a to 350c (see FIG. 4) are installed. The nozzle support parts 350a to 350c are made of a material such as, for example, nickel alloy or stainless steel.

Figure 4:
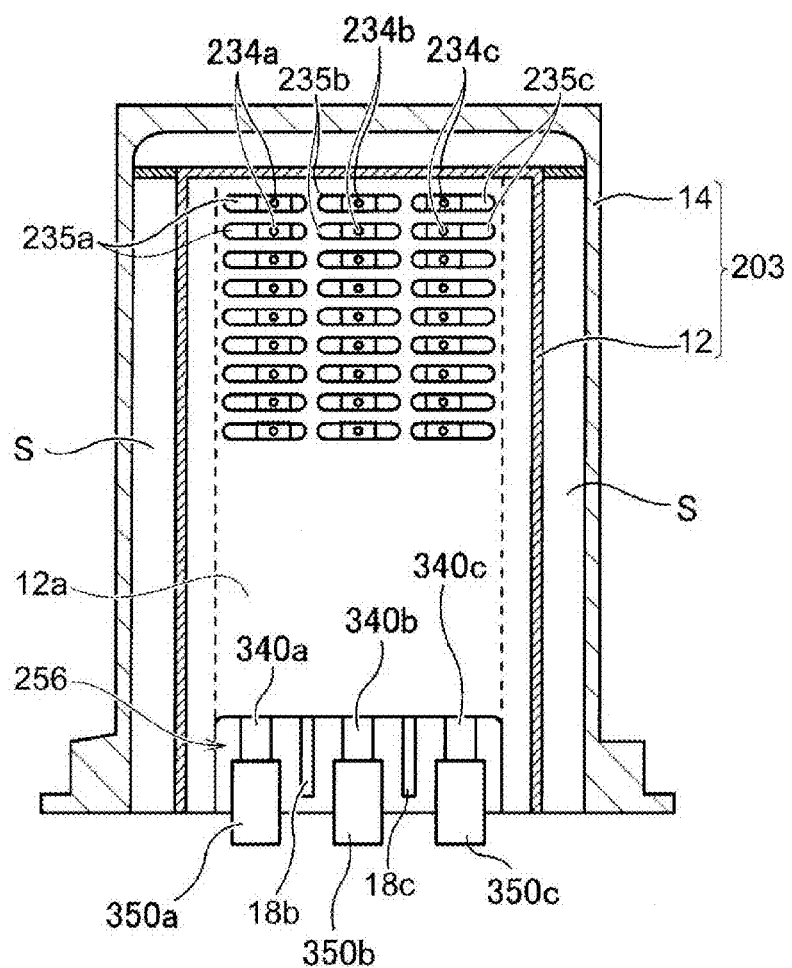
FIG. 4 is a vertical sectional view of the vertical processing furnace of the substrate processing apparatus according to the first embodiment.

Gas supply pipes 310a to 310c for supplying gases into the process chamber 201 are respectively connected to one ends of the nozzle support parts 350a to 350c (see FIG. 4). The nozzle support parts 350a to 350c to which the gas nozzles 340d and 340e are connected are unified by a forked pipe (not shown) which is connected to a gas supply pipe 310d.

The gas nozzles (gas injectors) 340a to 340d are respectively connected to the other ends of the nozzle support parts 350a to 350c (see FIG. 4) (only the nozzle support part 350a and the gas nozzle 340a are shown). The gas nozzles 340a to 340e are made of a heat-resistant material such as, for example, quartz or SiC.

A precursor gas supply source 360a for supplying a precursor gas, a mass flow controller (MFC) 320a as a flow rate controller, and a valve 330a as an opening/closing valve are installed in the gas supply pipe 310a sequentially from the upstream side. A precursor gas supply source 360b for supplying a precursor gas, an MFC 320b, and a valve 330b are installed in the gas supply pipe 310b sequentially from the upstream side.

An inert gas supply source 360c for supplying an inert gas, an MFC 320c, and a valve 330c are installed in the gas supply pipe 310c sequentially from the upstream side. In addition, an inert gas supply source 360d for supplying an inert gas, an MFC 320d, and a valve 330d are installed in in the gas supply pipe 310d sequentially from the upstream side.

A gas supply pipe 310e for supplying an inert gas is connected to the gas supply pipe 310a at the downstream side of the valve 330a. An inert gas supply source 360e, an MFC 320e, and a valve 330e are installed in the gas supply pipe 310e sequentially from the upstream side. A gas supply pipe 310f for supplying an inert gas is connected to the gas supply pipe 310b at the downstream side of the valve 330b. An inert gas supply source 360f, an MFC 320f, and a valve 330f are installed in the gas supply pipe 310f sequentially from the upstream side. The inert gas supply sources 360c to 360f for supplying the inert gas are connected to a common supply source. The gas supply pipes 310a to 310f, MFCs 320a to 320f and valves 330a to 330f constitute a gas supply (distribution) system. The system feeds gases to the reaction tube 203 via the gas nozzles 340a to 340e.

An example of the precursor gas supplied from the gas supply pipe 310a may include an ammonia ($NH_3$) gas. An example of the precursor gas supplied from the gas supply pipe 310b may include a silicon (Si) source gas. An example of the inert gas supplied from each of the gas supply pipes 310c to 310f may include a nitrogen ($N_2$) gas.

An exhaust port 230 is opened in the outer tube 14 of the reaction tube 203. The exhaust port 230 is formed below the second gas exhaust port 237 and is connected to an exhaust pipe 231.

A vacuum pump 246 as a vacuum exhaust device is coupled to the exhaust pipe 231 via a pressure sensor 245 as a pressure detector for detecting an internal pressure of the process chamber 201 and an APC (Auto Pressure Controller) valve 244 as a pressure regulator. The exhaust pipe 231 at the downstream side of the vacuum pump 246 is connected to a waste gas treatment device (not shown) or the like. Thus, by controlling an output of the vacuum pump 246 and an opening degree of the APC valve 244, a vacuum exhaust can be performed so that the internal pressure of the process chamber 201 can be maintained at a predetermined pressure (degree of vacuum).

The APC valve 244 is an opening/closing valve that can perform and stop the vacuum exhaust of the interior of the process chamber 201 by opening and closing the valve and that can regulate the internal pressure of the process chamber 201 by adjusting the opening degree of the valve to adjust conductance.

A temperature sensor (not shown) as a temperature detector is installed inside the reaction tube 203. By adjusting the electric power supplied to the heater 207 based on the temperature information detected by the temperature sensor, it is possible to make sure that the interior of the process chamber 201 has a desired temperature distribution.

In the processing furnace 202 configured as above, the boat 217 in which the plurality of wafers 200 to be processed in a batch manner is stacked in multiple stages is loaded into the process chamber 201 by the boat support base 218. Then, the wafers 200 loaded into the process chamber 201 are heated to a predetermined temperature by the heater 207.

Next, the configuration of the reaction tube 203 will be described with reference to FIGS. 2 to 5. In FIG. 3, the illustration of the gas nozzles 340a to 340e, the boat 217 and the like is omitted.

As shown in FIGS. 2 and 3, a plurality of gas supply slits 235a to 235c through which gases are supplied into the process chamber 201 is formed in the inner tube 12. The nozzle arrangement chamber 222 and the process chamber 201 are in fluid communication with each other by the gas supply slits 235a to 235c.

The nozzle arrangement chamber 222 is formed in a ring-shaped gap S between an outer peripheral surface 12c of the inner tube 12 and an inner peripheral surface 14a of the outer tube 14. The nozzle arrangement chamber 222 includes a first chamber 222a, a second chamber 222b and a third chamber 222c. The first to third chambers 222a to 222c are arranged side by side in the circumferential direction of the ring-shaped gap S.

The first chamber 222a is formed between a first partition 18a and a second partition 18b which extend from the outer peripheral surface 12c of the inner tube 12 toward the outer tube 14. A front wall of the first chamber 222a at the central side of the reaction tube 203 corresponds to the peripheral wall of the inner tube 12. Lateral walls of the first chamber 222a in the circumferential direction correspond to the first partition 18a and the second partition 18b. A portion of the first chamber 222a facing the outer tube 14 is opened.

Edges of the first partition 18a and the second partition 18b at the side of the outer tube 14 do not reach the peripheral wall of the outer tube 14. The edges of the first and second partitions 18a and 18b are spaced apart from the peripheral wall of the outer tube 14 so that a first opening 222d is formed. The first chamber 222a is in fluid communication with the gap S at the side of the exhaust port 230 through the first opening 222d.

The second chamber 222b is formed between the second partition 18b and the third partition 18c which extend from the outer peripheral surface 12c of the inner tube 12 toward the outer tube 14. A front wall of the second chamber 222b at the central side of the reaction tube 203 corresponds to the peripheral wall of the inner tube 12. Lateral walls of the second chamber 222b in the circumferential direction correspond to the second partition 18b and the third partition 18c.

A rear wall of the second chamber 222b at the side of the outer tube 14 is defined as a connection wall 18e formed by connecting the edge of the second partition 18b and an edge of the third partition 18c. The second chamber 222b is surrounded by the connection wall 18e, the peripheral wall of the inner tube 12, the second partition 18b and the third partition 18c.

The edge of the third partition 18c at the side of the outer tube 14 does not reach the peripheral wall of the outer tube 14. A communication passage 222e by which the first chamber 222a and the third chamber 222c are in fluid communication with each other is formed between the connection wall 18e which connects the partitions 18b and 18c and the peripheral wall of the outer tube 14.

The third chamber 222c is formed between the third partition 18c and a fourth partition 18d which extend from the outer peripheral surface 12c of the inner tube 12 toward the outer tube 14. A front wall of the third chamber 222c at the central side of the reaction tube 203 corresponds to the peripheral wall of the inner tube 12. Lateral walls of the third chamber 222c in the circumferential direction correspond to the third partition 18c and the fourth partition 18d. A portion of the third chamber 222c facing the outer tube 14 is opened.

An edge of the fourth partition 18d at the side of the outer tube 14 does not reach the peripheral wall of the outer tube 14. Portions of the third and fourth partitions 18c and 18d facing the outer tube 14 are opened so that a second opening 222f is formed in the first partition 18d. The third chamber 222c is in fluid communication with the gap S at the side of the exhaust port 230 through the second opening 222f.

If the opening areas of the first opening 222d and the second opening 222f are increased, the amount of the gases supplied from the gas nozzles 340a and 340c to the wafers 200 existing in the inner tube 12 decreases. Therefore, a distance R between the edge of the first partition 18a and the peripheral wall of the outer tube 14 and a distance between the edge of the second partition 1b and the peripheral wall of the outer tube 14 may fall within a range of 1 mm to 5 mm, specifically 2 mm to 5 mm.

The first to fourth partitions 18a to 18d and the connection wall 18e are formed to extend from the upper end to the lower end of the inner tube 12. Thus, each of the first to third chambers 222a to 222c has a roofed shape with the lower end portion thereof opened and the upper end portion thereof closed by a wall body constituting the top surface of the inner tube 12.

As shown in FIG. 2, the gas nozzles 340a to 340c extending in the vertical direction are respectively installed in the first to third chambers 222a to 222c of the nozzle arrangement chamber 222.

The gas nozzles 340a to 340c adjacent to each other are partitioned by the second and third partitions 18b and 18c. This makes it possible to prevent the gases supplied from the gas nozzles 340a to 340c from mixing inside the nozzle arrangement chamber 222.

Further, the gas nozzle 340b is disposed in the second chamber 222b which is surrounded by the peripheral wall of the inner tube 12, the second partition 18b, the third partition 18c and the connection wall 18e. As a result, it is possible to increase the ratio of the gas flowing out to the surfaces of the wafers 200.

Outwardly-convex portions 12b, formed by being convex outward from an inner peripheral surface 12a in an arc shape, are formed in the peripheral wall of the inner tube 12. A pair of outwardly-convex portions 12b is formed at each of both sides of the first gas exhaust port 236 so as to extend in the vertical direction. Gas nozzles 340d and 340e are respectively disposed in the outwardly-convex portions 12b at the side of the nozzle arrangement chamber 222.

Each of the gas nozzles 340a to 340c is installed to extend upward from below inside the nozzle arrangement chamber 222. The gas nozzles 340d and 340e are installed to extend upward from below inside the respective outwardly-convex portions 12b.

Each of the gas nozzles 340a to 340e is configured as an I-like long nozzle. Gas supply holes 234a to 234e through which gases are supplied are formed in lateral surfaces of the gas nozzles 340a to 340e, respectively. The gas supply holes 234a to 234e are opened so as to face the center of the reaction tube 203, respectively. The gases supplied from the gas supply holes 234a to 234e travel toward the central portion of the reaction tube 203.

The gas nozzles 340a and 340c, which are one example of first gas nozzles, inject the inert gas through the gas supply holes 234a and 234c, which are examples of first supply holes opened toward the respective gas supply slits 235a and 235c as examples of respective gas inlets. The gas nozzle 340b as one example of a second gas nozzle, which is different from the first gas nozzle described above, discharges the precursor gas inside the second chamber 222b, which is a space defined by the second and third partitions 18b and 18c surrounding the gas nozzle 340b. The loss of pressure in the gas supply hole 234b as one example of a second supply hole of the gas nozzle 340b is smaller than the loss of pressure in the gas supply holes 234a and 234c as examples of the first supply holes of the gas nozzles 340a and 340c.

As an example of the specific configuration, an opening area of the gas supply hole 234b of the gas nozzle 340b, which is one example of the second supply hole, is made larger than those of the gas supply holes 234a and 234c of the gas nozzles 340a and 340c. This makes it possible to reduce the loss of pressure in the gas supply hole 234b of the gas nozzle 340b as compared to the gas supply holes 234a and 234c of the gas nozzles 340a and 340c.

The first partition 18a and the fourth partition 18d disposed at the side of the first gas exhaust port 236, among the first to fourth partitions 18a to 18d corresponding to the gas nozzles 340a to 340c, constitute the lateral walls of the first chamber 222a and the third chamber 222c.

The first opening 222d through which the inert gas supplied from the gas nozzle 340a, which is one example of the first gas nozzle, flows is opened at the side of the first partition 18a. The second opening 222f through which the inert gas supplied from the gas nozzle 340c, which is one example of the first gas nozzle, flows is opened at the side of the fourth partition 18d.

Therefore, the inert gas from the gas nozzle 340a is supplied as a purge gas to the gap S at the side of the exhaust port 230 via the first opening 222d. This makes a pressure at the side of the gas nozzle 340a in the gap S positive against a pressure at the side of the exhaust port 230 in the gap S. Such a configuration implements a discharge means for discharging the gas staying in the gap S from the exhaust port 230. Further, the inert gas from the gas nozzle 340c is supplied as a purge gas to the gap S at the side of the exhaust port 230 via the second opening 222f. This makes a pressure at the side of the gas nozzle 340c in the gap S positive against a pressure at the side of the exhaust port 230 in the gap S. Such a configuration implements a discharge means for discharging the gas staying in the gap S from the exhaust port 230.

With the above configurations, it is possible to efficiently purge the gap S between the inner tube 12 and the outer tube 14 and prevent the gases from staying in the gap S. This shortens a purge time. Further, the prevention of the gases from staying in the gap S suppresses generation of particles. Furthermore, since the purge gas is supplied from outside of the inner tube 12, it is possible to assist an increase in the internal pressure of the process chamber 201 during a high pressure process.

In the peripheral wall of the inner tube 12, the first gas exhaust port 236 is opened in a portion facing the position where the nozzle arrangement chamber 222 is formed. The first gas exhaust port 236 is formed so that a region where the wafers 200 are accommodated in the process chamber 201 is sandwiched between the first gas exhaust port 236 and the nozzle arrangement chamber 222. The first gas exhaust port 236 is formed in a region (wafer region) extending from a lower end portion to an upper end portion of the process chamber 201. Inside the process chamber 201, the wafers 200 are accommodated in the wafer region.

In the peripheral wall of the inner tube 12, the second gas exhaust port 237 is formed in a portion below the first gas exhaust port 236. Through the second gas exhaust port 237, the process chamber 201 and the gap S are in fluid communication with each other. The atmosphere in the lower portion of the process chamber 201 is exhausted through the second gas exhaust port 237.

That is to say, the first gas exhaust port 236 is a gas exhaust port for exhausting the internal atmosphere of the process chamber 201 to the gap S. The gas exhausted from the first gas exhaust port 236 is exhausted from the exhaust pipe 231 to outside of the reaction tube 203 via the gap S defined outside the inner tube 12 and the exhaust port 230. The gas exhausted from the second gas exhaust port 237 is exhausted from the exhaust pipe 231 to outside of the reaction tube 203 via the lower side of the gap S and the exhaust port 230.

With such a configuration, it is possible to exhaust the gas passed through the wafers from outside of the process chamber 201 of a cylindrical shape, and reduce a difference between a pressure of the exhaust device such as the vacuum pump 246 or the like and a pressure of the wafer region. This minimizes the pressure loss. The minimization of the pressure loss decreases the pressure of the wafer region, which makes it possible to increase a flow velocity in the wafer region and alleviate a loading effect.

Thus, a main exhaust path 20 is formed as shown in FIG. 1. Through the main exhaust path 20, an internal atmosphere of the inner tube 12 is exhausted via the first gas exhaust port 236 as one example of the outlet port formed in the wall surface facing the gas supply slits 235a to 235c in the inner tube 12, the gap S, and the exhaust port 230 formed in the outer tube 14.

Further, an auxiliary exhaust path 22 is formed. Through the auxiliary exhaust path 22, the internal atmosphere of the inner tube 12 is exhausted outside via the second gas exhaust port 237 as another example of the outlet port formed in the wall surface facing the gas supply slits 235a to 235c in the inner tube 12, the gap S, and the exhaust port 230 formed in the outer tube 14.

FIG. 4 is a view showing the configuration of the gas supply slits 235a to 235c. The illustration of the boat 217 and the like is omitted.

A plurality of horizontally-elongated gas supply slits 235a, which is in fluid communication with the first chamber 222a of the nozzle arrangement chamber 222, is formed in the peripheral wall of the inner tube 12 along the vertical direction. A plurality of horizontally-elongated gas supply slits 235b, which is in fluid communication with the second chamber 222b, is formed adjacent to the gas supply slits 235a along the vertical direction. A plurality of horizontally-elongated gas supply slits 235c, which is in fluid communication with the third chamber 222c, is formed adjacent to the gas supply slits 235b along the vertical direction.

In other words, the gas supply slits 235a to 235c are formed in a matrix shape having a plurality of columns and a plurality of rows in the left-right-up-down direction.

If lengths of the gas supply slits 235a to 235c in the circumferential direction of the inner tube 12 are set to be equal to lengths of the respective chambers 222a to 222c inside the nozzle arrangement chamber 222 in the circumferential direction, the gas supply efficiency may be improved. Further, if the gas supply slits 235a to 235c are formed to be horizontally elongated and be disposed in a plurality of columns in the vertical direction except for the connection portions between the partitions 18a to 18d and the peripheral wall of the inner tube 12, the gas supply efficiency may be improved.

The gas supply slits 235a to 235c are formed so that edge portions as four corners have curved surfaces with roundness. By rounding the edge portions to have a curved surface shape, it is possible to suppress the stagnation of the gas at peripheries of the edge portions. This suppresses a film from being formed at the edge portions, and further suppresses peeling of the film formed at the edge portions.

An opening 256 for installing the gas nozzles 340a to 340c in the respective chambers 222a to 222c of the nozzle arrangement chamber 222 is formed in a lower end of the inner peripheral surface 12a of the inner tube 12 at the side of the nozzle arrangement chamber 222.

The gas nozzles 340a to 340c are installed as follows. The gas nozzles 340a to 340c are inserted into the respective chambers 222a to 222c from the opening 256. Lower ends of the gas nozzles 340a to 340c are temporally raised to be higher than upper ends of the respective nozzle support parts 350a to 350c. Then, the lower ends of the gas nozzles 340a to 340c are lowered to be lower than the upper ends of the nozzle support parts 350a to 350c. Thus, the lower ends of the gas nozzles 340a to 340c are inserted into the respective nozzle support parts 350a to 350c.

Thus, as shown in FIG. 2, the gas nozzles 340a to 340c are accommodated in the respective chambers 222a to 222c of the nozzle arrangement chamber 222. Gases from the gas nozzles 340a to 340c are supplied into the inner tube 12 via the respective gas supply slits 235a to 235c which are examples of the inlet ports formed in the inner tube 12 constituting the front wall of each of the first to third chambers 222a to 222c. At this time, the gas flows of the gases flowing from the gas nozzles 340a to 340c along the outer peripheral surface 12c of the inner tube 12 are suppressed by the respective partitions 18a to 18d.

Each of the partitions 18a to 18d of the nozzle arrangement chamber 222 is formed to extend from a ceiling portion of the nozzle arrangement chamber 222 to above the lower end portion of the reaction tube 203. Specifically, as shown in FIG. 4, the lower ends of the partitions 18b and 18c are formed to extend from an upper edge of the opening 256 to the vicinity of a lower edge thereof. In other words, the lower ends of the respective partitions 18b and 18c are formed above the lower end portion of the reaction tube 203 to extend from upper end portions of the nozzle support parts 350a to 350c to the vicinity of lower end portions thereof, respectively.

Figure 5:
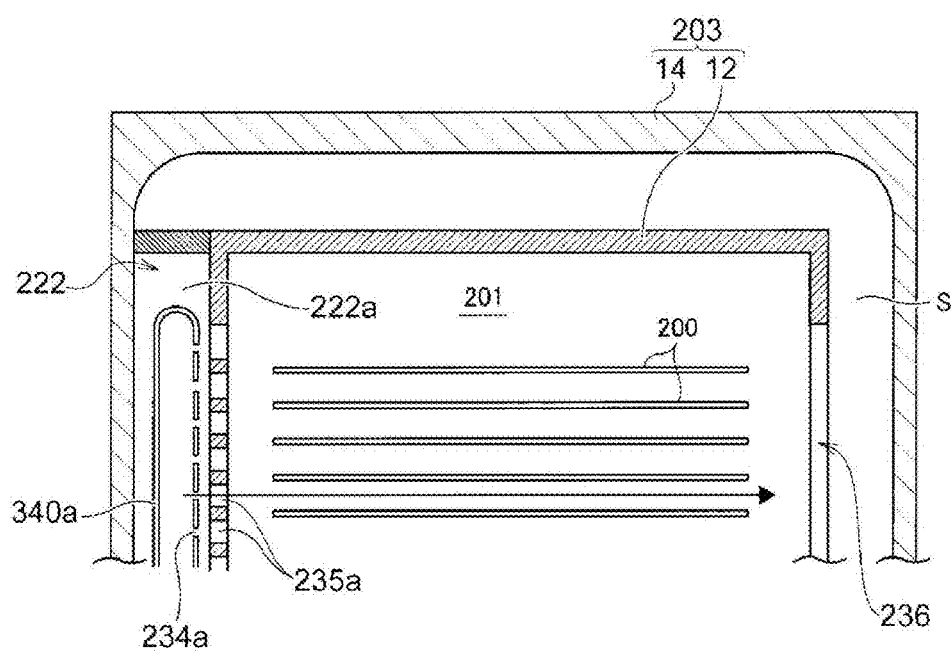
FIG. 5 is an enlarged sectional view of an upper portion of the vertical processing furnace of the substrate processing apparatus according to the first embodiment.

As shown in FIG. 5, the gas supply slits 235a to 235c are formed so as to be respectively arranged between the adjacent wafers 200 mounted in multiple stages on the boat 217 that is accommodated in the process chamber 201 (only the gas supply slits 235a are shown). In FIG. 5, the boat 217 is omitted for the sake of convenience in illustration.

The gas supply slits 235a to 235c may be formed between the two adjacent wafers W, between the top plate and the uppermost wafer 200, and between the lowermost wafer W and the bottom plate, namely in the entire area ranging from between the lowermost wafer 200 that can be mounted on the boat 217 and the bottom plate of the boat 217 to between the uppermost wafer 200 that can be mounted on the boat 217 and the top plate of the boat 217.

The gas supply holes 234a to 234c of the gas nozzles 340a to 340c may be formed at vertical central portions of the respective gas supply slits 235a to 235c on a one-to-one basis. As an example, assuming that 25 gas supply slits 235a to 235c are formed, 25 gas supply holes 234a to 234c may be formed in a corresponding relationship with the 25 gas supply slits 235a to 235c. That is to say, the gas supply slits 235a to 235c and the gas supply holes 234a to 234c may be formed by the number of the wafers 200 to be mounted plus one. Such a slit configuration allows a processing gas to flow parallel to the respective wafer 200 on the respective wafers 200 (see an arrow in FIG. 5).

As shown in FIG. 1, the first gas exhaust port 236 is formed in the wafer region of the inner tube 12 so that the process chamber 201 is in fluid communication with the gap S. The second gas exhaust port 237 is formed to extend from a position higher than an upper end of the exhaust port 230 to a position higher than a lower end of the exhaust port 230.

Figure 6:
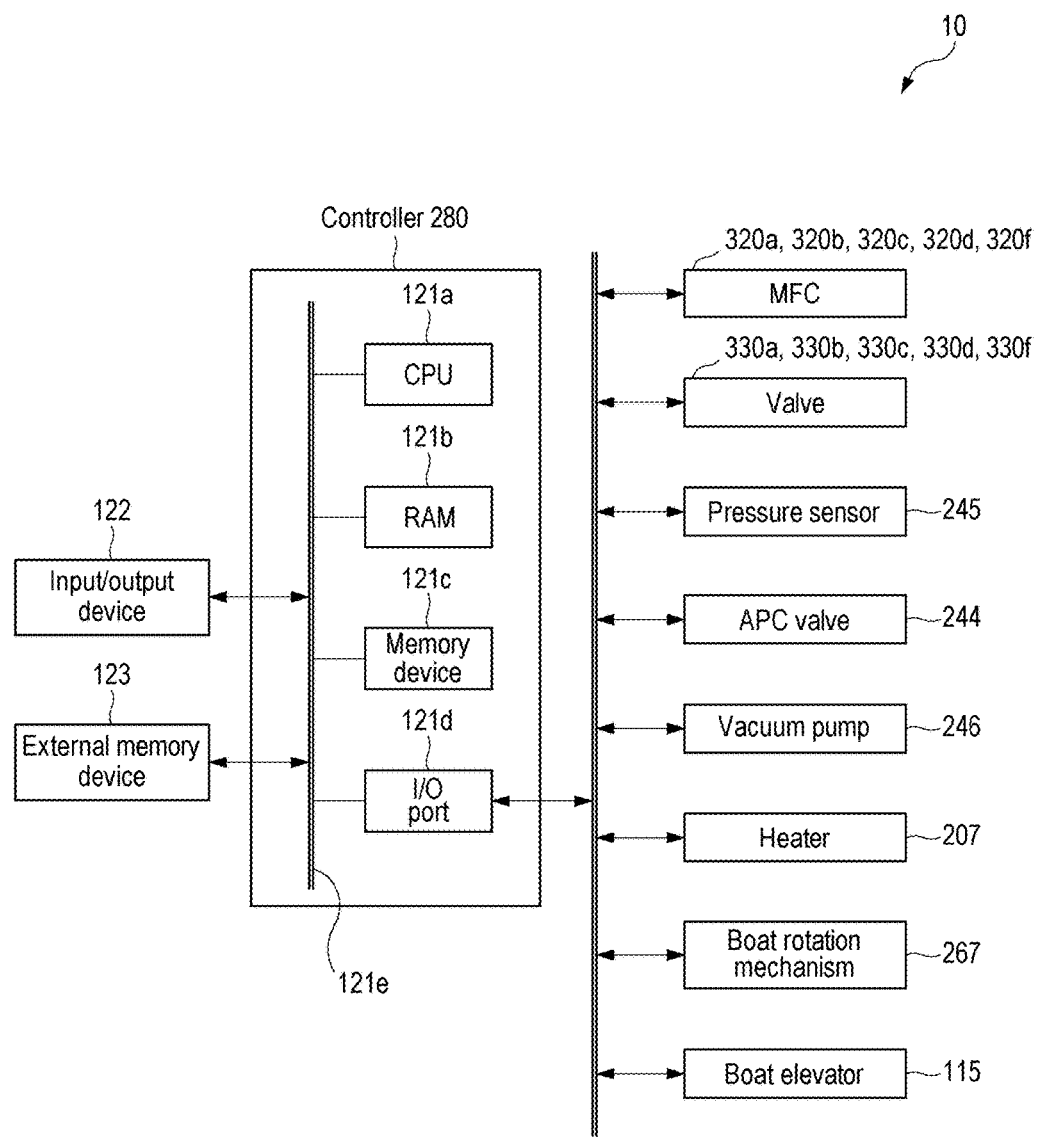
FIG. 6 is a block diagram showing the substrate processing apparatus according to the first embodiment.

FIG. 6 is a block diagram showing the substrate processing apparatus 10. A controller 280 which is a control part (control means) of the substrate processing apparatus 10 is configured as a computer. The computer includes a CPU (Central Processing Unit) 121a, a RAM (Random Access Memory) 121b, a memory device 121c and an I/O port 121d.

The RAM 121b, the memory device 121c and the I/O port 121d are configured to exchange data with the CPU 121a via an internal bus 121e. An input/output device 122 configured by, for example, a touch panel or the like is connected to the controller 280.

The memory device 121c is configured by, for example, a flash memory, a hard disc drive (HDD), or the like. A control program for controlling operations of the substrate processing apparatus 10, a process recipe in which sequences and conditions of a substrate process to be described later are written, and the like are readably stored in the memory device 121c.

The process recipe functions as a program for causing the controller 280 to execute each sequence in the substrate process (to be described later) to obtain a predetermined result. Hereinafter, the process recipe and the control program will be generally and simply referred to as a "program."

When the term "program" is used herein, it may indicate a case of including only the process recipe, a case of including only the control program, or a case of including both the process recipe and the control program. The RAM 121b is configured as a memory area (work area) in which a program or data read by the CPU 121a is temporarily stored.

The I/O port 121d is connected to the MFCs 320a to 320f, the valves 330a to 330f, the pressure sensor 245, the APC valve 244, the vacuum pump 246, the heater 207, the temperature sensor, the boat rotation mechanism 267, the boat elevator 115, and the like.

The CPU 121a is configured to read and execute the control program from the memory device 121c. The CPU 121a is also configured to read the process recipe from the memory device 121c according to an operation command inputted from the input/output device 122.

The CPU 121a is configured to control, according to the contents of the process recipe thus read, the flow rate adjusting operation of various kinds of gases performed by the MFCs 320a to 320f, the opening/closing operation of the valves 330a to 330f, and the opening/closing operation of the APC valve 244. Furthermore, the CPU 121a is configured to control the pressure regulating operation performed by the APC valve 244 based on the pressure sensor 245, the driving and stopping of the vacuum pump 246, and the temperature adjusting operation performed by the heater 207 based on the temperature sensor. In addition, the CPU 121a is configured to control the operation of rotating the boat 217 with the boat rotation mechanism 267 and adjusting the rotation speed of the boat 217, the operation of raising and lowering the boat 217 with the boat elevator 115, and the like.

The controller 280 is not limited to being configured as a dedicated computer, but may be configured as a general-purpose computer. For example, the controller 280 of the present embodiment may be configured by preparing an external memory device 123 which stores the aforementioned program, and installing the program in the general-purpose computer using the external memory device 123. Examples of the external memory device include a magnetic disk such as a hard disk or the like, an optical disk such as a CD or the like, a magneto-optical disk such as an MO or the like, a semiconductor memory such as a USB memory or the like, and so forth.

However, the means for supplying the program to the computer is not limited to the case where the program is supplied via the external memory device 123. For example, the program may be supplied using a communication means such as the Internet or a dedicated line without going through the external memory device 123. The memory device 121c and the external memory device 123 are configured as a non-transitory computer-readable non-transitory recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123.

Next, an operation outline of the substrate processing apparatus 10 according to the present disclosure will be described in accordance with a control procedure performed by the controller 280. The boat 217 on which a predetermined number of wafers 200 are mounted is loaded into the reaction tube 203 in advance, and the reaction tube 203 is hermetically sealed by the seal cap 219.

When the control by the controller 280 is started, the controller 280 operates the vacuum pump 246 and the APC valve 244 to exhaust the internal atmosphere of the reaction tube 203 from the exhaust port 230 (in an exhaust procedure).

When the exhaust operation is completed after a predetermined period of time, the controller 280 opens the valves 330b and 330f to supply a silicon (Si) source gas as a precursor gas from the gas nozzle 340b, which is one example of the second gas nozzle, together with a nitrogen gas as a carrier. At the same time, the controller 280 closes the valve 330a and opens the valves 330c to 330f to supply a nitrogen ($N_2$) gas as an inert gas from the gas nozzles 340a and 340c to 340f. Thus, the wafers 200 are processed so that layers are formed (in a first processing procedure).

At this time, the controller 280 operates the vacuum pump 246 and the APC valve 244 so that the pressure obtained from the pressure sensor 245 becomes constant, thereby discharging the internal atmosphere of the reaction tube 203 from the reaction tube 203. In this way, a negative pressure is supplied into the reaction tube 203.

As a result, the precursor gas flows on each wafer 200 in a parallel relationship with each wafer W, passes through the first gas exhaust port 236 and the second gas exhaust port 237, and subsequently, flows downward from top in the gap S. Thereafter, the precursor gas is exhausted from the exhaust pipe 231 through the exhaust port 230.

In this processing procedure, an inert gas is supplied from the gas nozzles 340a and 340c to 340e toward the center of each wafer 200. At this time, by controlling the supply amount of the inert gas from each of the gas nozzles 340a and 340c to 340e with the controller 280, the concentration of the inert gas at the central portion of each wafer 200 is adjusted so as to be lower than that of the inert gas at the outer peripheral portion of each wafer 200. This makes it possible to control the supply amount of the precursor gas toward the central portion of each wafer 200. It is therefore possible to make the in-plane thickness distribution of the layer formed on each wafer 200 by the precursor gas closer to a flat distribution or a centrally convex distribution from a centrally concave distribution.

At this time, the first opening 222d for discharging the inert gas supplied from the respective gas nozzle 340a therethrough is opened at the side of the first partition 18a arranged near the exhaust port 230. Therefore, a portion of the inert gas supplied from the gas nozzle 340a is discharged to one side (counterclockwise CCW in a plan view of FIG. 2) with the nozzle arrangement chamber 222 as a boundary. This makes a pressure at the side of the nozzle arrangement chamber 222 in the gap S positive against a pressure at the side of the exhaust port 230 in the gap S. As a result, the gas staying in the gap S between the inner tube 12 and the outer tube 14 can be purged out from the exhaust port 230.

The second opening 222f for discharging the inert gas supplied from the respective gas nozzle 340c therethrough is opened at the side of the fourth partition 18d arranged near the exhaust port 230. Therefore, a portion of the inert gas supplied from the gas nozzle 340c can be discharged to the other side (clockwise CW in a plan view of FIG. 2) with the nozzle arrangement chamber 222 as a boundary. This makes a pressure at the side of the nozzle arrangement chamber 222 in the gap S positive against a pressure at the side of the exhaust port 230 in the gap S. As a result, the gas staying in the gap S between the inner tube 12 and the outer tube 14 can be purged out from the exhaust port 230.

Then, when the process is completed after a predetermined period of time, the controller 280 closes the valve 330b to stop the supply of the precursor gas from the gas nozzle 340b, and opens the valve 330f to supply the inert gas from the gas nozzle 340b. Further, the controller 280 controls the vacuum pump 246 and the APC valve 244 to increase the negative pressure to be generated inside the reaction tube 203, so that the internal atmosphere of the reaction tube 203 is exhausted from the exhaust port 230. At the same time, the valves 330a and 330c are opened to supply the inert gas from the gas nozzles 340a and 340c which are examples of the first gas nozzle. Thus, the gas staying in the gap S between the inner tube 12 and the outer tube 14 is purged out from the exhaust port 230 (in a discharge procedure).

Subsequently, when the purging-out is completed after a predetermined period of time, the controller 280 opens the valves 330a and 330e to supply an ammonia ($NH_3$) gas as a precursor gas from the gas nozzle 340a together with a nitrogen ($N_2$) gas as a carrier. At the same time, the controller 280 closes the valve 330b and opens the valves 330c, 330d and 330f to supply a nitrogen ($N_2$) gas as an inert gas from the gas nozzles 340a, 340c, 340d and 340f. Thus, the wafer 200 is subjected to a subsequent process (in a second processing procedure).

At this time, the controller 280 operates the vacuum pump 246 and the APC valve 244 so that the pressure obtained from the pressure sensor 245 becomes constant. Thus, the internal atmosphere of the reaction tube 203 is discharged from the exhaust port 230, generating a negative pressure inside the reaction tube 203.

As a result, the precursor gas flows parallel to each wafer 200 and on each wafer 200, passes through the first gas exhaust port 236 and the second gas exhaust port 237, flows from the upper portion of the gap S toward the lower portion thereof, and followed by being discharged from the exhaust pipe 231 through the exhaust port 230.

Thereafter, when the process is completed after a predetermined period of time, the controller 280 closes the valve 330a to stop the supply of the precursor gas from the gas nozzle 340a. Further, the controller 280 controls the vacuum pump 246 and the APC valve 244 to increase the negative pressure to be generated inside the reaction tube 203, so that the internal atmosphere of the reaction tube 203 is exhausted from the exhaust port 230. At the same time, the valves 330a and 330c are opened to supply the inert gas from the gas nozzles 340a and 340c, and the gas staying in the gap S between the inner tube 12 and the outer tube 14 is purged out from the exhaust port 230 (in a discharge procedure). At this time, the valve 330b is opened to supply the inert gas also from the gas nozzle 340b.

When the process of the wafer 200 is completed by repeating a cycle including the first processing procedure, the discharge procedure, the second processing procedure and the discharge procedure a predetermined number of times, the boat 217 is unloaded from the reaction tube 203 in a reverse order of the operation described above. The wafer 200 is transferred from the boat 217 to a pod of a transfer shelf by a wafer transfer machine (not shown). The pod is transferred from the transfer shelf to a pod stage by a pod transfer machine and is carried out outside a housing by an external transfer device.

The substrate processing apparatus 10 used in the above described operation needs a regular cleaning with cleaning gas such as fluorine fed by the gas nozzles 340a and others. Due to residual gas affects the quality of deposition film, even if in minute amounts, purging out such residue from the reaction tube by flowing a purge gas from the gas nozzles 340a and others may be carried out.

According to the present embodiment, one or more of the following effects may be obtained.

(a) In the gap S between the inner tube 12 and the outer tube 14, the pressure at the side of the nozzle arrangement chamber 222 can be set to be positive against the pressure at the side of the exhaust port 230. As a result, the gas staying in the gap S between the inner tube 12 and the outer tube 14 can be purged out from the exhaust port 230. Further, since it is possible to minimize the staying of the gas in the gap S, it is possible to suppress byproducts from adhering and being generated inside the reaction tube 203, thus suppressing generation of particles.

(b) The circulation efficiency of the purge gas can be improved with respect to the gap S between the inner tube 12 and the outer tube 14 of the double tube structure.

(c) Since the first opening 222d and the second opening 222f for discharging the inert gas from the gas nozzles 340a and 340c therethrough are formed at the side of the first partition 18a and the fourth partition 18d near the exhaust port 230, the pressure at the side of the nozzle arrangement chamber 222 in the gap S can be set to be positive against the pressure at the side of the exhaust port 230 in the gap S. This implements a simplified configuration as compared with a case where a pipe for applying a positive pressure is additionally installed.

(d) The pressure loss in the gas supply holes 234b of the gas nozzle 340b for discharging the precursor gas is smaller than the pressure loss in the gas supply holes 234a and 234e of the gas nozzles 340a and 340c for injecting the inert gas. Therefore, it is possible to suppress undesirable decomposition of the precursor gas and to increase the supply amount of the precursor gas supplied to the wafers 200. In addition, it is possible to suppress the entry of the inert gas into the second chamber 222b in which the gas nozzle 340b for discharging the precursor gas is installed.

(e) By discharging the nitrogen ($N_2$) gas from the gas nozzles 340a and 340c after gas cleaning, the cleaning gas staying in the gap S can be efficiently purged, and furthermore, when the nitrogen gas is discharged by repeatedly supplying and discharging at a large flow rate, the gas wind (blowing) could physically remove the cleaning gas or film on which the cleaning gas is adsorbed from the surfaces of the inner tube and the outer tube. As a result, the time required for removing the cleaning gas can be greatly shortened.

Comparative Example

Figure 7:
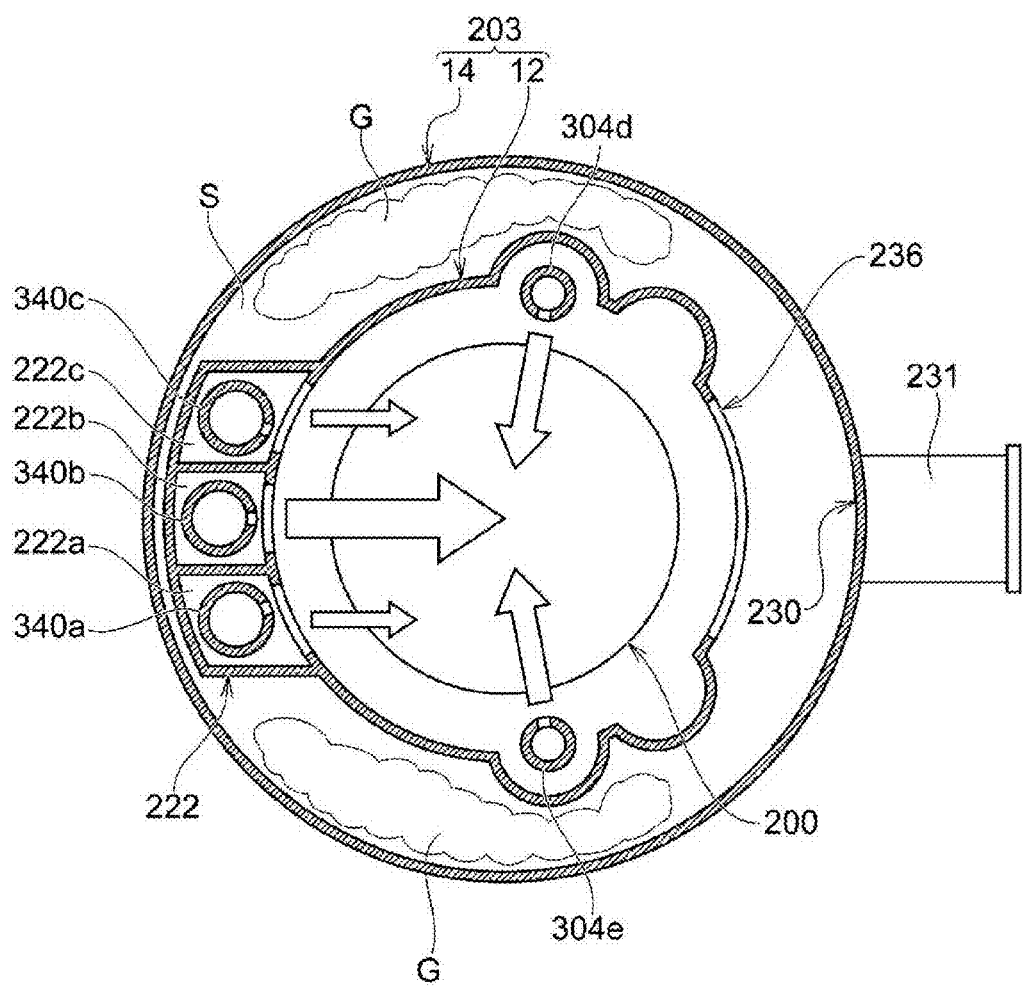
FIG. 7 is a vertical sectional view of a vertical processing furnace according to a comparative example.

FIG. 7 is a view showing a comparative example. As compared with the present embodiment, the openings 222d and 222f in the partitions 18a and 18d are not formed so that the respective chambers 222a to 222c are formed to have a closed cross section.

In the reaction tube 203 of this comparative example, no pressure difference occurs in the gap S so that the precursor gas G may stay in the gap S. Since a narrow gap between the nozzle arrangement chamber 222 and the outer tube 12 is at the farthest end from the exhaust port 230 and has a symmetric geometry, the gas in the narrow gap is discharged by diffusion only. In this case, byproducts tend to be generated in the gap S, which may be a cause of generation of particles.

On the other hand, in the present embodiment, the pressure at the side of the nozzle arrangement chamber 222 in the gap S is set to be positive against the pressure at the side of the exhaust port 230 in the gap S, whereby the gas staying in the gap S can be purged out from the exhaust port 230. As a result, it is possible to minimize the staying of the gas in the gap S and the generation of byproducts, thereby reducing the generation of particles.

<Analysis Result>

Figure 8:
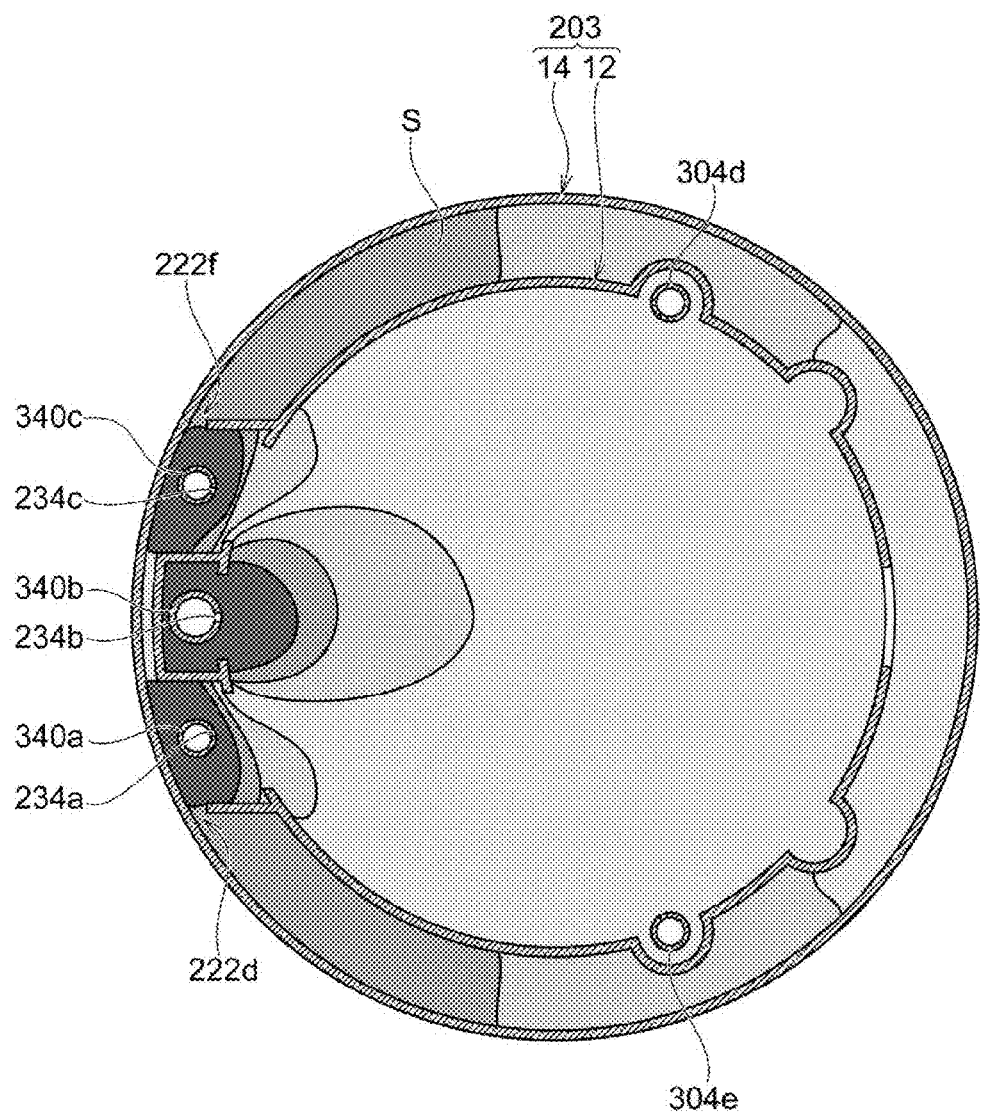
FIG. 8 is an analysis result showing a concentration distribution of a silicon source gas inside a reaction tube of the substrate processing apparatus according to the first embodiment.

FIG. 8 is an analysis result showing a concentration distribution of the silicon source gas in the reaction tube 203.

From this analysis result, it can be confirmed that the inert gas supplied from the gas nozzles 340a and 340c flows into the gap S to purge out the gas staying in the gap S from the exhaust port 230.

(First Modification of the First Embodiment)

Figure 9:
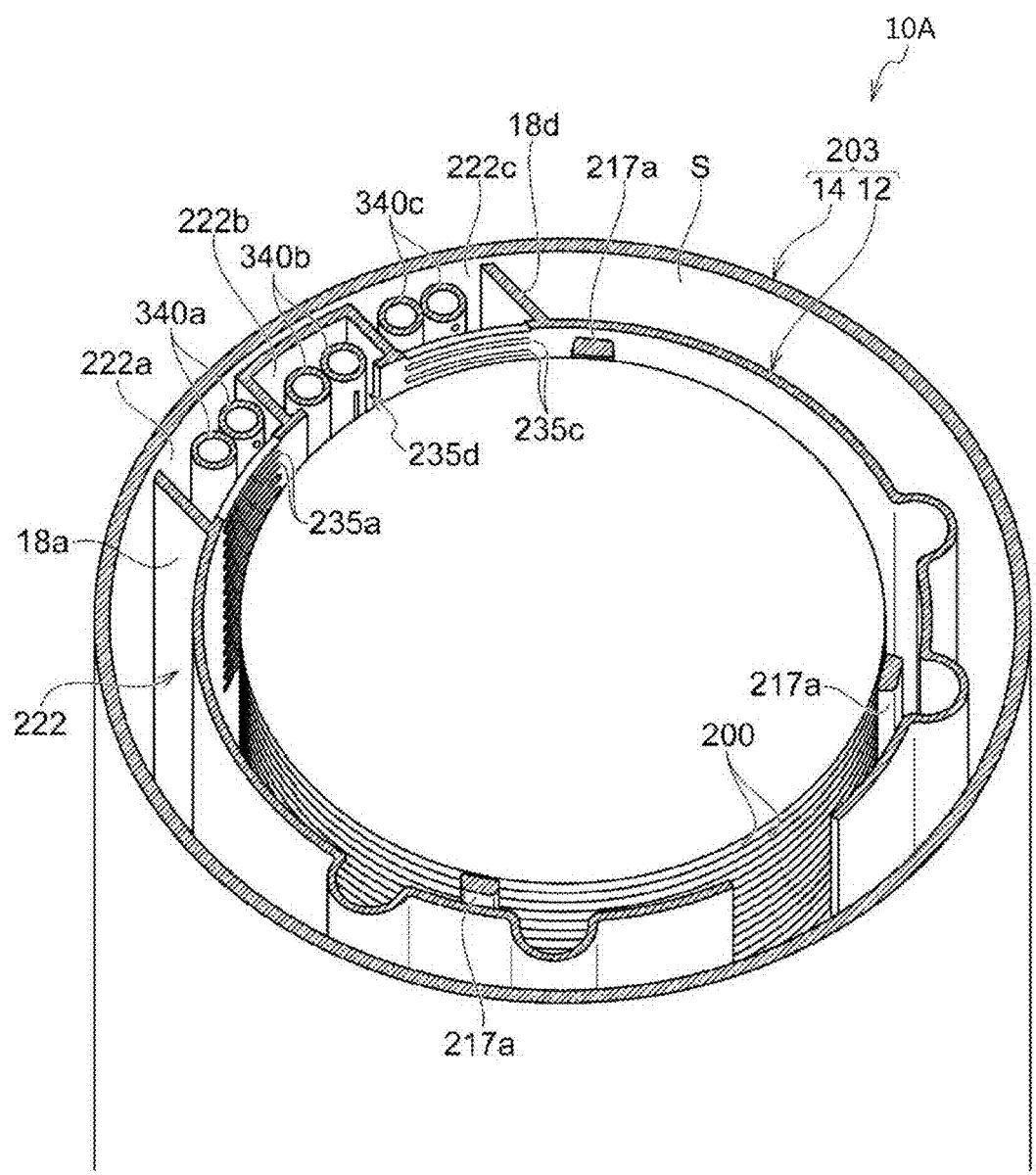
FIG. 9 is a perspective sectional view of a vertical processing furnace of a substrate processing apparatus according to a first modification of the first embodiment.
Figure 10:
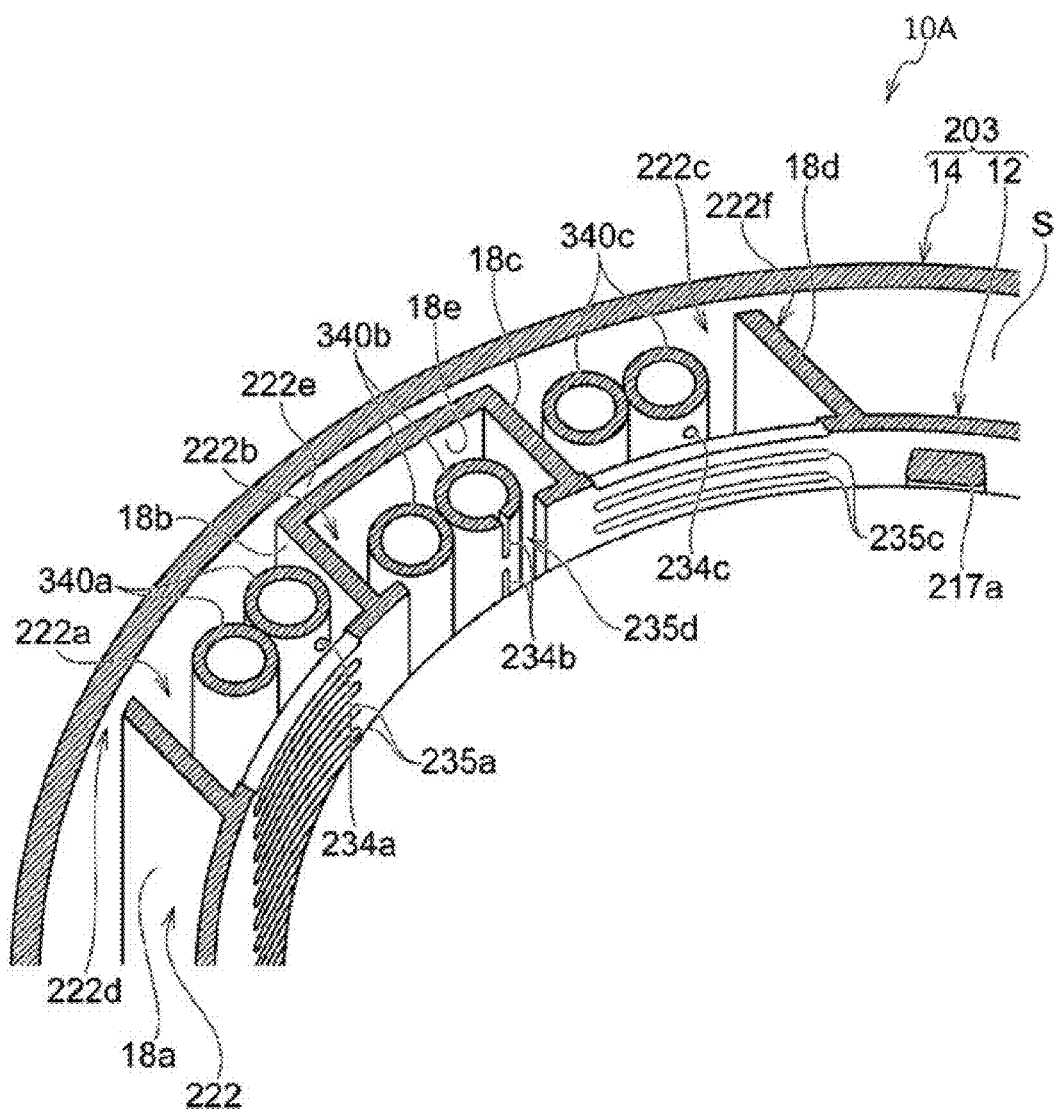
FIG. 10 is an enlarged view showing a main portion of FIG. 9.

FIGS. 9 and 10 are views showing a first modification of the first embodiment, in which the same or equivalent parts as those of the first embodiment are denoted by like reference numerals. The descriptions of the same or equivalent parts are omitted, and only different parts will be described. In FIGS. 9 and 10, the illustration of the gas nozzles 340d and 340e of the first embodiment are omitted.

In a substrate processing apparatus 10A according to the first modification of the first embodiment, the gas nozzle 340b for supplying the precursor gas and the gas nozzles 340a and 340c for supplying the inert gas are formed in a U-shape that is folded at upper ends, respectively.

The gas supply hole 234b for supplying the precursor gas is formed at a downward portion of the gas nozzle 340b as an elongated hole or holes extending in the length direction of the gas nozzle 340b and has an averaged opening area per unit length larger than that of the gas supply holes 234b of the first embodiment. Accordingly, the pressure loss at the gas supply hole 234b of the gas nozzle 340b for supplying the precursor gas is smaller than the pressure loss at the gas supply holes 234a and 234c of the gas nozzles 340a and 340c for supplying the inert gas.

An inlet port 235d for supplying the precursor gas from the gas nozzle 340b into the inner tube 12 is formed in the inner tube 12 as a continuous aperture with a width roughly equivalent to a width of the gas nozzle 340b and height roughly equivalent to a height of wafer region. This configuration enables the gas supply hole 234b to nearly face the wafers 200. In other words, a distance of the gas nozzle 340b to the center of the inner tube 12 is shorter than that of other nozzles, for example, roughly the same as a radius of the inner tube 12. Thus, the gas nozzle 340b allows the precursor gas ejected from the gas supply hole 234b at a relatively low injection pressure to reach the wafers 200 effectively.

Even in the first modification of the first embodiment having the above-described configuration, it is possible to obtain the same operational effects as those of the first embodiment.

(Second Modification of the First Embodiment)

Figure 11:
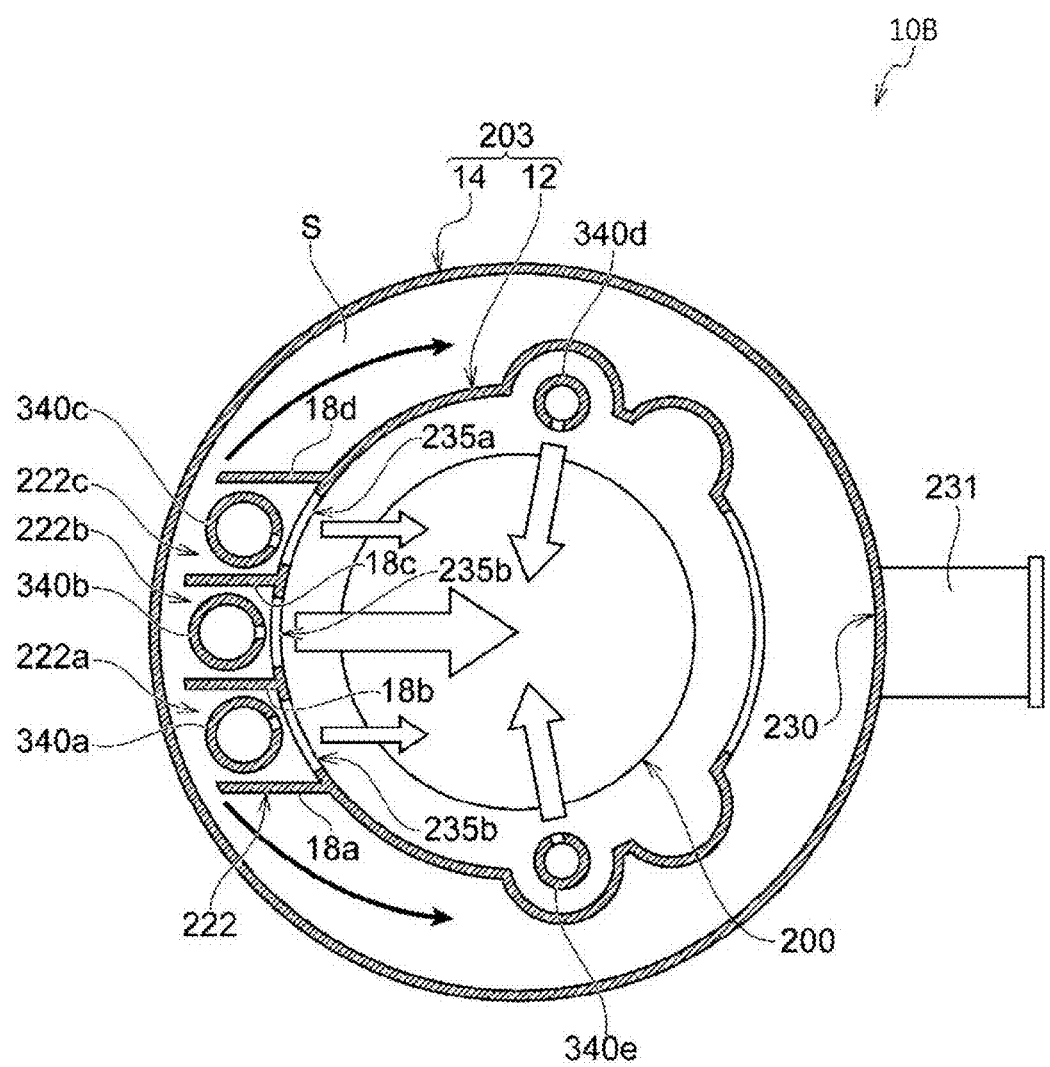
FIG. 11 is a horizontal sectional view of a vertical processing furnace of a substrate processing apparatus according to a second modification of the first embodiment.

FIG. 11 is a view showing a second modification of the first embodiment, in which the same or equivalent parts as those of the first embodiment are denoted by like reference numerals. The descriptions of the same or equivalent parts are omitted, and only different parts will be described.

That is to say, in the reaction tube 203 of a substrate processing apparatus 10B according to the second modification of the first embodiment, as compared with the first embodiment, the connection wall 18e for connecting the edge of the second partition 18b and the edge of the third partition 18c in the nozzle arrangement chamber 222 is not formed. As a result, a rear portion of the second chamber 222b accommodating the gas nozzle 340b for supplying the precursor gas in the nozzle arrangement chamber 222 is opened.

Even with such a configuration, it is possible to obtain the same operational effects as those of the first embodiment.

(Third Modification of the First Embodiment)

Figure 12:
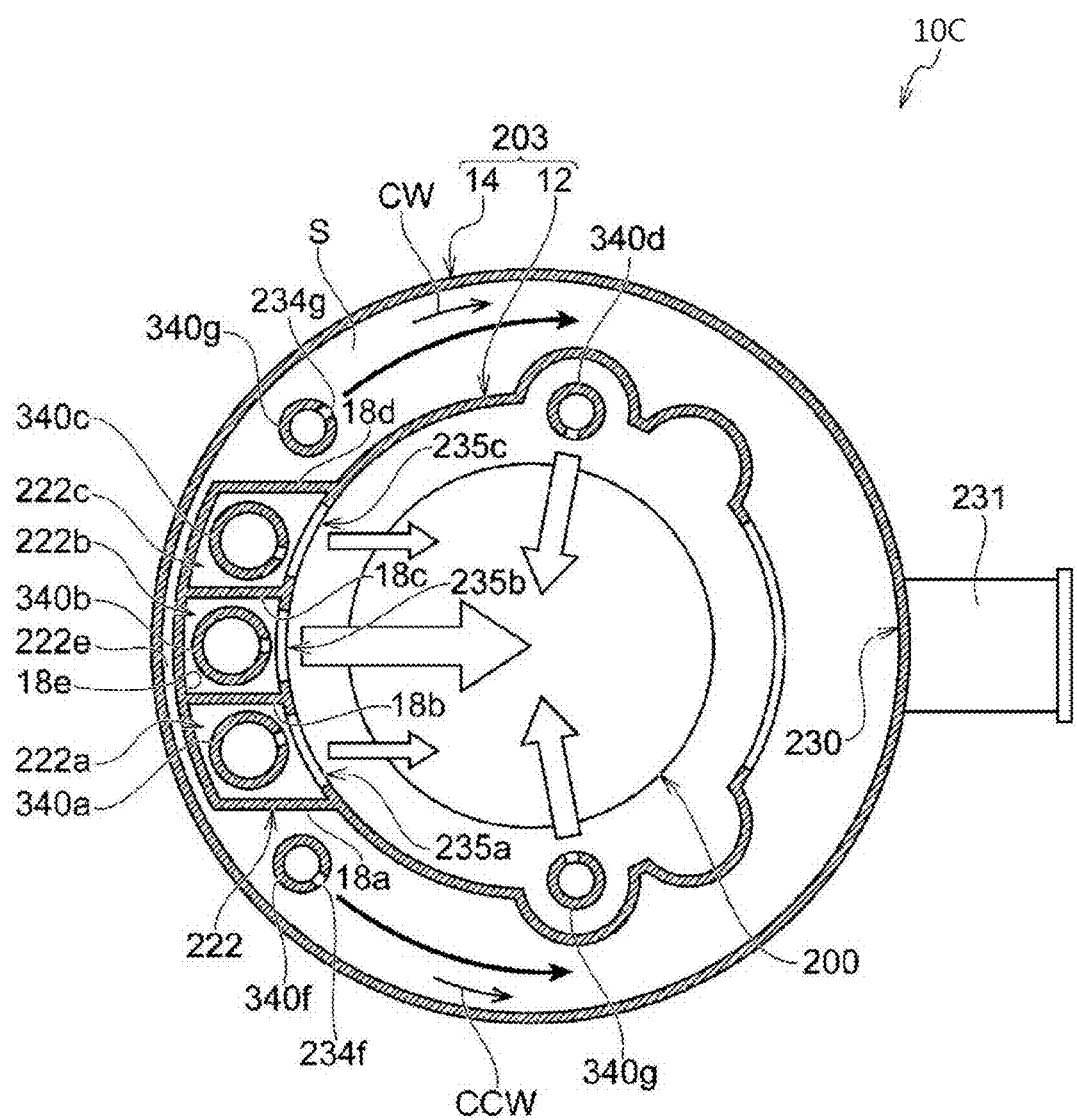
FIG. 12 is a horizontal sectional view of a vertical processing furnace of a substrate processing apparatus according to a third modification of the first embodiment.

FIG. 12 is a view showing a third modification of the first embodiment, in which the same or equivalent parts as those of the first embodiment are denoted by like reference numerals. The descriptions of the same or equivalent parts are omitted, and only different parts will be described.

That is to say, in the reaction tube 203 of a substrate processing apparatus 10C according to the third modification of the first embodiment, as compared with the first embodiment, a connection wall 18e that connects the second partition 18b and the third partition 18c of the nozzle arrangement chamber 222 is formed to extend to both the first partition 18a and the fourth partition 18d. As a result, in the nozzle arrangement chamber 222, the chambers 222a and 222c of the gas nozzles 340a and 340c for supplying the inert gas are closed by the connection wall 18e at the side of the outer tube 14. Thus, a communication path 222e is formed between the connection wall 18e and the outer tube 14.

The gas nozzle 340f for supplying the inert gas is installed at one side (counterclockwise CCW in a plan view of FIG. 12) with the nozzle arrangement chamber 222 as a boundary. In the gas nozzle 340f, a plurality of elongated gas supply holes 234f extending in the length direction of the gas nozzle 340f is formed at intervals.

The gas supply holes 234f of the gas nozzle 340f are opened toward the exhaust port 230 in the circumferential direction of the reaction tube 203. By supplying the inert gas from the gas supply holes 234f of the gas nozzle 340f, a pressure at the side of the gas nozzles 340a to 340c in the gap S is set to be positive against a pressure at the side of the exhaust port 230 in the gap S.

As a result, the gas staying at one side (counterclockwise CCW in a plan view of FIG. 12) with the nozzle arrangement chamber 222 as a boundary can be purged out from the exhaust port 230.

A gas nozzle 340g for supplying the inert gas is installed at the other side (clockwise CW in a plan view of FIG. 12) with the nozzle arrangement chamber 222 as a boundary. In the gas nozzle 340g, a plurality of elongated gas supply holes 234g extending in the length direction of the gas nozzle 340g is formed at intervals.

The gas supply holes 234g of the gas nozzle 340g are opened toward the exhaust port 230 in the circumferential direction of the reaction tube 203. By supplying the inert gas from the gas supply holes 234g of the gas nozzle 340g, a pressure at the side of the gas nozzles 340a to 340c in the gap S is set to be positive against a pressure at the side of the exhaust port 230 in the gap S.

As a result, the gas staying on the other side (clockwise CW in a plan view of FIG. 12) with the nozzle arrangement chamber 222 as a boundary can be purged out from the exhaust port 230.

Even with such a configuration, it is possible to obtain the same operational effects as those of the first embodiment.

Further, even when it is difficult to form the first opening 222d and the second opening 222f at the sides of the partitions 18a and 18d, the gas staying in the gap S can be purged out from the exhaust port 230.

(Fourth Modification of the First Embodiment)

Figure 13:
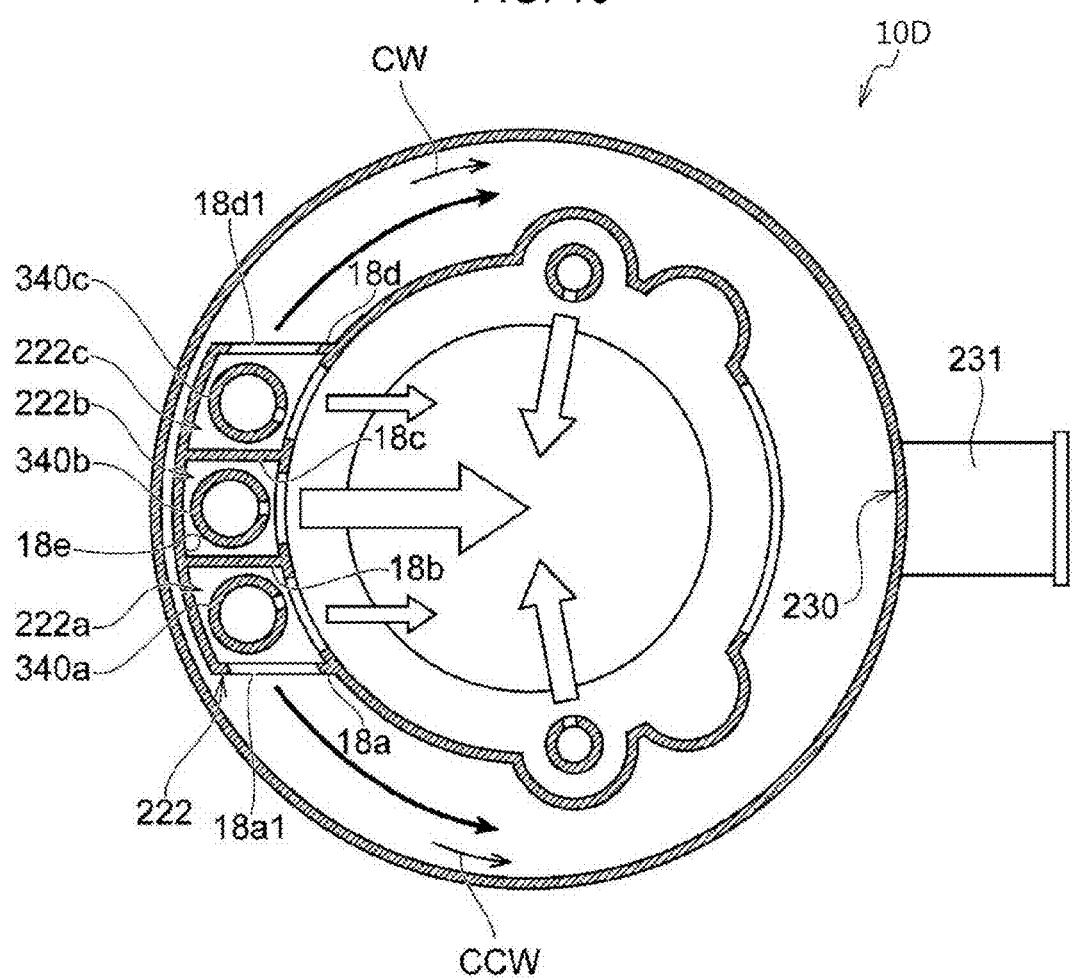
FIG. 13 is a horizontal sectional view of a vertical processing furnace of a substrate processing apparatus according to a fourth modification of the first embodiment.

FIG. 13 is a view showing a fourth modification of the first embodiment. The fourth modification of the first embodiment is a modification of the third modification of the first embodiment. The same or equivalent parts as those of the third modification of the first embodiment are denoted by like reference numerals. The descriptions of the same or equivalent parts are omitted, and only different parts will be described.

That is to say, in a substrate processing apparatus 10D according to the fourth modification of the first embodiment, as compared with the third modification of the first embodiment, the gas nozzles 340f and 340g respectively arranged at one and the other sides of the nozzle arrangement chamber 222 are omitted.

On the other hand, an opening 18a1 is formed in the first partition 18a at one side (counterclockwise CCW in a plan view of FIG. 13) with the nozzle arrangement chamber 222 as a boundary. The inert gas from the gas nozzle 340a is supplied to one side in the gap S via the opening 18a1. As a result, a pressure at the side of the gas nozzles 340a to 340c in the gap S is set to be positive against a pressure at the side of the exhaust port 230 in the gap S. Thus, the gas staying at the one side (the counterclockwise CCW in a plan view of FIG. 13) with the nozzle arrangement chamber 222 as a boundary is purged out by the inert gas supplied from the gas nozzle 340a.

In addition, an opening 18d1 is formed in the fourth partition 18d at the other side (clockwise CW in a plan view of FIG. 13) with the nozzle arrangement chamber 222 as a boundary. The inert gas supplied from the gas nozzle 340c is supplied to the other side in the gap S via the opening 18d1. As a result, a pressure at the side of the gas nozzles 340a to 340c in the gap S is set to be positive against a pressure at the side of the exhaust port 230 in the gap S. Thus, the gas staying at the other side (the clockwise CW in a plan view of FIG. 13) with the nozzle arrangement chamber 222 as a boundary is purged out by the inert gas supplied from the gas nozzle 340c.

Even in the present embodiment, it is possible to obtain the same operational effects as those of the third modification of the first embodiment.

Furthermore, by removing the gas nozzles 340f and 340g, it is possible to achieve cost reduction.

(Fifth Modification of the First Embodiment)

Figure 14:
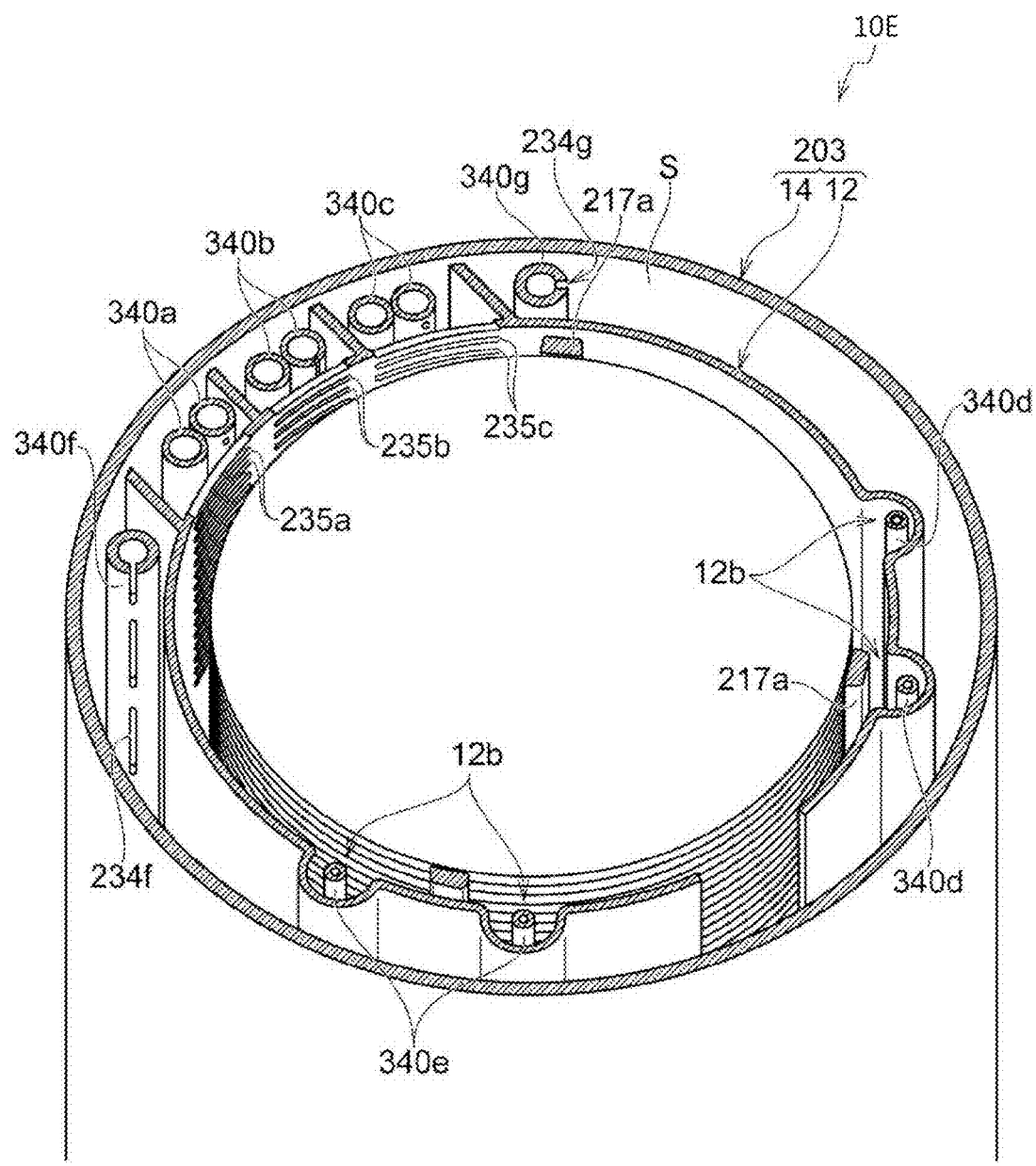
FIG. 14 is a perspective sectional view of a vertical processing furnace of a substrate processing apparatus according to a fifth modification of the first embodiment.

FIG. 14 is a view showing a fifth modification of the first embodiment. The fifth modification of the first embodiment is a modification of the third modification of the first embodiment. The same or equivalent parts as those of the third modification of the first embodiment are denoted by like reference numerals. The descriptions of the same or equivalent parts are omitted, and only different parts will be described.

That is to say, in a substrate processing apparatus 10E according to the fifth modification of the first embodiment, the gas nozzle 340b for supplying the precursor gas and the gas nozzles 340a and 340c for supplying the inert gas are formed in a U-shape that is folded at upper ends, respectively. In addition, gas nozzles 340d and 340e are installed in the respective outwardly-convex portions 12b formed in the inner tube 12.

Even with such a configuration, it is possible to obtain the same operational effects as those of the third modification of the first embodiment.

(Sixth Modification of the First Embodiment)

Figure 15:
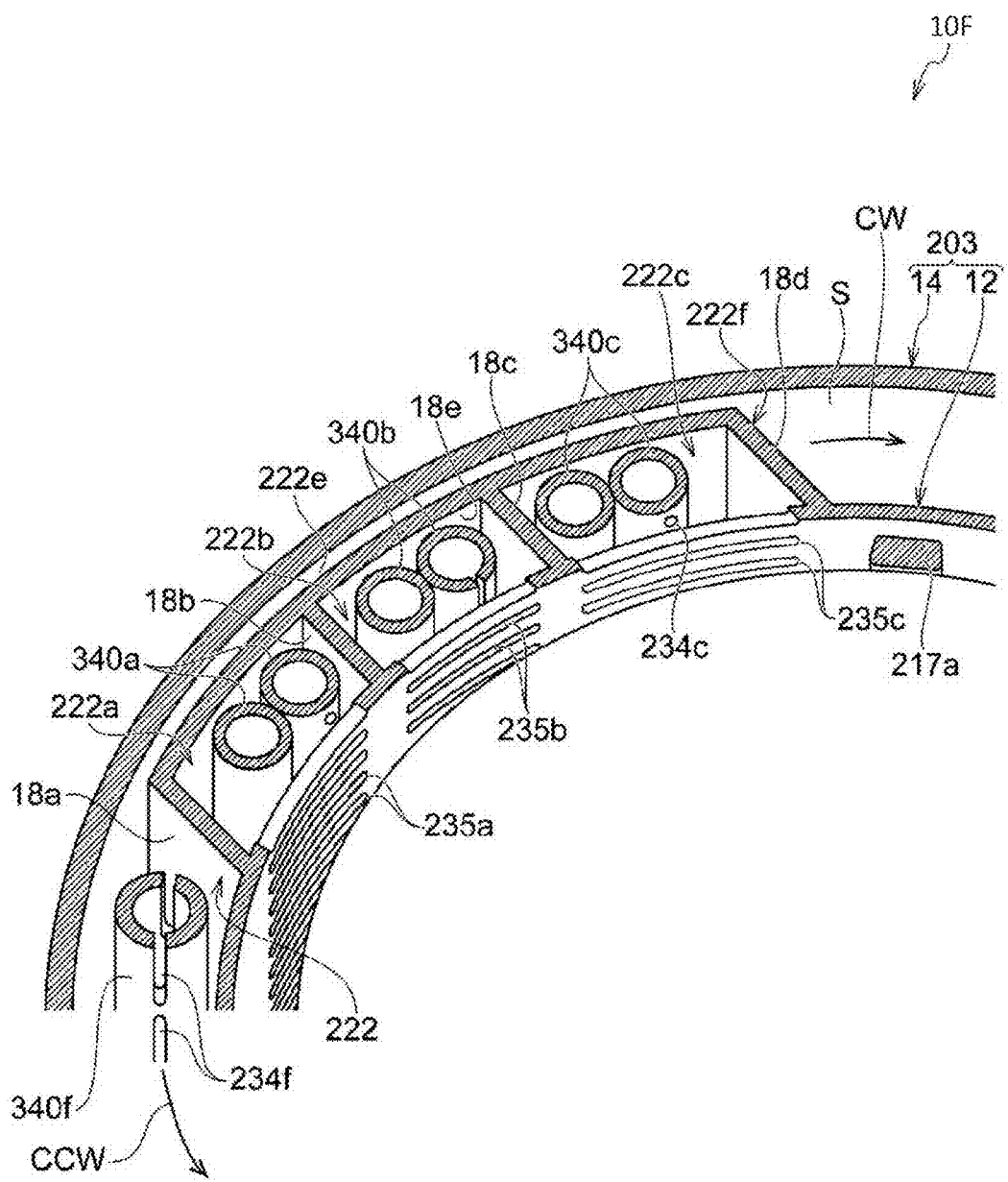
FIG. 15 is a perspective sectional view showing a main portion of a vertical processing furnace of a substrate processing apparatus according to a sixth modification of the first embodiment.

FIG. 15 is a view showing a sixth modification of the first embodiment. The sixth modification of the first embodiment is a modification of the fifth modification of the first embodiment. The same or equivalent parts as those of the fifth modification of the first embodiment are denoted by like reference numerals. The descriptions of the same or equivalent parts are omitted, and only different parts will be described.

That is to say, in a substrate processing apparatus 10F according to the sixth modification of the first embodiment, as compared with the fifth modification of the first embodiment, the gas nozzle 340g installed at the other side (the clockwise CW in a plan view of FIG. 15) with the nozzle arrangement chamber 222 as a boundary is removed.

On the other hand, in the gas nozzle 340f installed at one side (the counterclockwise CCW in a plan view of FIG. 15) with the nozzle arrangement chamber 222 as a boundary, the gas supply holes 234f are opened toward both the nozzle arrangement chamber 222 and the exhaust port 230 in the circumferential direction of the reaction tube 203.

The connection wall 18e that connects the second partition 18b and the third partition 18c of the nozzle arrangement chamber 222 extends to both the first partition 18a and the fourth partition 18d. As a result, in the nozzle arrangement chamber 222, the chambers 222a and 222c of the gas nozzles 340a and 340c for supplying the inert gas are closed by the connection wall 18e at the side of the outer tube 14. Thus, a communication path 222e is formed between the connection wall 18e and the outer tube 14.

Even with such a configuration, it is possible to obtain the same operational effects as those of the fifth modification of the first embodiment.

The communication path 222e by which one side and the other side of the nozzle arrangement chamber 222 are in fluid communication with each other is formed at the side of the gas nozzles 340a to 340c which has a pressure that is positive against a pressure at the side of the exhaust port 230 in the gap S by the inert gas supplied from the gas nozzle 340f.

Thus, by virtue of the inert gas supplied from the gas nozzle 340f, the gas staying at one side (the counterclockwise CCW in a plan view of FIG. 15) and the other side (the clockwise CW in a plan view of FIG. 15) with the nozzle arrangement chamber 222 as a boundary can be purged out from the exhaust port 230.

Therefore, as compared with the case where the gas nozzles 340f and 340g are installed at both sides with the nozzle arrangement chamber 222 as a boundary, it is possible to further achieve cost reduction.

According to the present disclosure in some embodiments, it is possible to provide a technique of suppressing byproducts from being generated in a gap between an outer tube and an inner tube which constitute a reaction tube.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a reaction tube including a cylindrical inner tube and a cylindrical outer tube installed so as to surround the cylindrical inner tube;
a substrate holder accommodated in the cylindrical inner tube and configured to hold a plurality of substrates in a vertical direction;
gas nozzles installed in a gap between the cylindrical outer tube and the cylindrical inner tube to extend along the vertical direction, and having a plurality of supply holes formed in the vertical direction, from which gas is supplied toward one or more inlet ports formed in the cylindrical inner tube;
a gas supply system configured to feed the gas to the reaction tube through the gas nozzles;
an outlet port formed in the cylindrical inner tube and configured to allow the gas supplied to the cylindrical inner tube to flow into the gap therethrough;
a discharge port formed in the cylindrical outer tube and configured to discharge the gas flowing out from the outlet port to outside of the reaction tube; and
a controller configured to control the gas supply system to supply a precursor gas and an inert gas, as the gas, so that a film is formed on each of the plurality of substrates,
wherein at least one nozzle of the gas nozzles, from which the inert gas is supplied, is in fluid communication with the gap,
wherein the discharge port is in fluid communication with the gap, and
wherein the inert gas supplied from the at least one nozzle is directly supplied into the gap, flown through the gap without being flown through inside the cylindrical inner tube, and flown out to the discharge port such that gas that has stayed in the gap is purged with the inert gas.

2. The apparatus of claim 1, wherein the gas nozzles includes a first gas nozzle configured to supply the inert gas into the cylindrical inner tube and a second gas nozzle configured to supply the precursor gas into the cylindrical inner tube, and
wherein each of the first gas nozzle and the second gas nozzle is surrounded by a plurality of partitions, and a first opening communicating with the gap is formed at a side of at least one of the plurality of partitions which surrounds the first gas nozzle.

3. The apparatus of claim 2, wherein the cylindrical inner tube includes the one or more inlet ports through which the gas supplied from the gas nozzles is introduced into the cylindrical inner tube,
wherein the inert gas is supplied through the first gas nozzle from a first supply hole which is opened toward a corresponding inlet port of the one or more inlet ports with a first pressure loss,
wherein the precursor gas is supplied through the second gas nozzle from a second supply hole which is opened toward a corresponding inlet port of the one or more inlet ports with a second pressure loss, and
wherein the second pressure loss is smaller than the first pressure loss.

4. The apparatus of claim 2, wherein the gas nozzles includes a third gas nozzle on an opposite side of the second gas nozzle from the first gas nozzle, configured to supply the inert gas into the cylindrical inner tube, and
wherein the first opening is formed at one of the plurality of partitions surrounding the first gas nozzle on an opposite side of the second gas nozzle and a second opening is formed at another one of the plurality of partitions surrounding the third gas nozzle on an opposite side of the second gas nozzle,
wherein the plurality of partitions are symmetrically formed at the farthest end from the discharge port.

5. A reaction tube for use in a substrate processing apparatus, comprising:
a cylindrical inner tube having a closed end; and
a cylindrical outer tube having a closed end,
wherein the cylindrical outer tube includes an exhaust port which is in fluid communication with a gap between the cylindrical inner tube and the cylindrical outer tube and configured to exhaust an internal atmosphere of the reaction tube,
wherein the cylindrical inner tube includes a plurality of inlet ports and an outlet port, the plurality of inlet ports being configured to inwardly guide gas supplied from a plurality of gas nozzles arranged in the gap, a plurality of partitions configured to surround each of the plurality of gas nozzles or to separate the plurality of gas nozzles from each other, and the outlet port being configured to be opened at a position facing the inlet port and configured to guide the internal atmosphere to the gap,
wherein at least one of the plurality of partitions, which corresponds to at least one nozzle of the plurality of gas nozzles, has an opening formed to allow the at least one nozzle to communicate with the gap, and
wherein an inert gas supplied from the at least one nozzle is directly supplied into the gap, flown through the gap, and flown out to the exhaust port such that gas that has stayed in the gap is purged with the inert gas.

* * * * *